(12) United States Patent
Tamura et al.

(10) Patent No.: US 9,076,863 B2
(45) Date of Patent: Jul. 7, 2015

(54) SEMICONDUCTOR STRUCTURE WITH A DOPED REGION BETWEEN TWO DEEP TRENCH ISOLATION STRUCTURES

(71) Applicant: Texas Instruments Incorporated, Dallas, TX (US)

(72) Inventors: Takehito Tamura, Ichikawa (JP); Binghua Hu, Plano, TX (US); Sameer Pendharkar, Allen, TX (US); Guru Mathur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/944,864

(22) Filed: Jul. 17, 2013

(65) Prior Publication Data

US 2015/0021687 A1 Jan. 22, 2015

(51) Int. Cl.
*H01L 29/78* (2006.01)
*H01L 21/762* (2006.01)
*H01L 29/06* (2006.01)

(52) U.S. Cl.
CPC .......... *H01L 29/7816* (2013.01); *H01L 21/762* (2013.01); *H01L 29/06* (2013.01)

(58) Field of Classification Search
CPC ... H01L 29/06; H01L 29/7816; H01L 21/762; H01L 29/0638

USPC .......................................................... 257/343
See application file for complete search history.

(56) References Cited

U.S. PATENT DOCUMENTS

| | | | |
|---|---|---|---|
| 8,049,283 B2 * | 11/2011 | Kim et al. ...................... | 257/371 |
| 8,258,575 B2 * | 9/2012 | Williams et al. ............... | 257/349 |
| 2001/0015470 A1 * | 8/2001 | Gregory ......................... | 257/511 |
| 2005/0161737 A1 * | 7/2005 | Mori .............................. | 257/346 |
| 2005/0179111 A1 * | 8/2005 | Chao .............................. | 257/510 |
| 2005/0194639 A1 * | 9/2005 | Negoro et al. ................. | 257/341 |
| 2006/0076629 A1 * | 4/2006 | Yilmaz .......................... | 257/378 |
| 2008/0191277 A1 * | 8/2008 | Disney et al. ................. | 257/343 |
| 2009/0179276 A1 * | 7/2009 | Voldman ........................ | 257/369 |
| 2009/0273030 A1 * | 11/2009 | Schrems et al. .............. | 257/337 |
| 2010/0096697 A1 * | 4/2010 | Su et al. ........................ | 257/343 |
| 2010/0295126 A1 * | 11/2010 | Ito .................................. | 257/343 |
| 2011/0062547 A1 * | 3/2011 | Onishi et al. ................. | 257/510 |
| 2012/0049274 A1 * | 3/2012 | Elattari et al. ................ | 257/330 |
| 2012/0094457 A1 * | 4/2012 | Gabrys .......................... | 438/286 |
| 2013/0270606 A1 * | 10/2013 | Chen et al. .................... | 257/183 |
| 2014/0001545 A1 * | 1/2014 | Yang et al. .................... | 257/337 |

* cited by examiner

*Primary Examiner* — Peter Bradford
(74) *Attorney, Agent, or Firm* — Jacqueline J. Garner; Frank Cimino

(57) ABSTRACT

The density of a transistor array is increased by forming one or more deep trench isolation structures in a semiconductor material. The deep trench isolation structures laterally surround the transistors in the array. The deep trench isolation structures limit the lateral diffusion of dopants and the lateral movement of charge carriers.

13 Claims, 30 Drawing Sheets

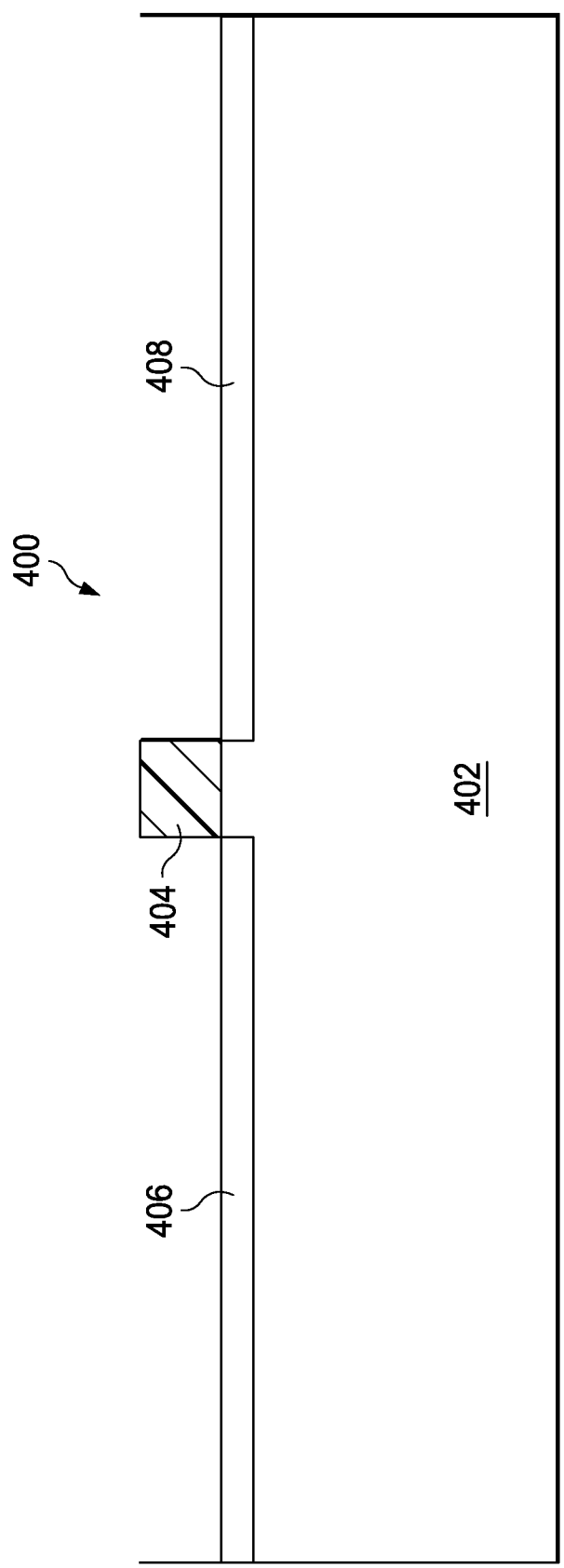

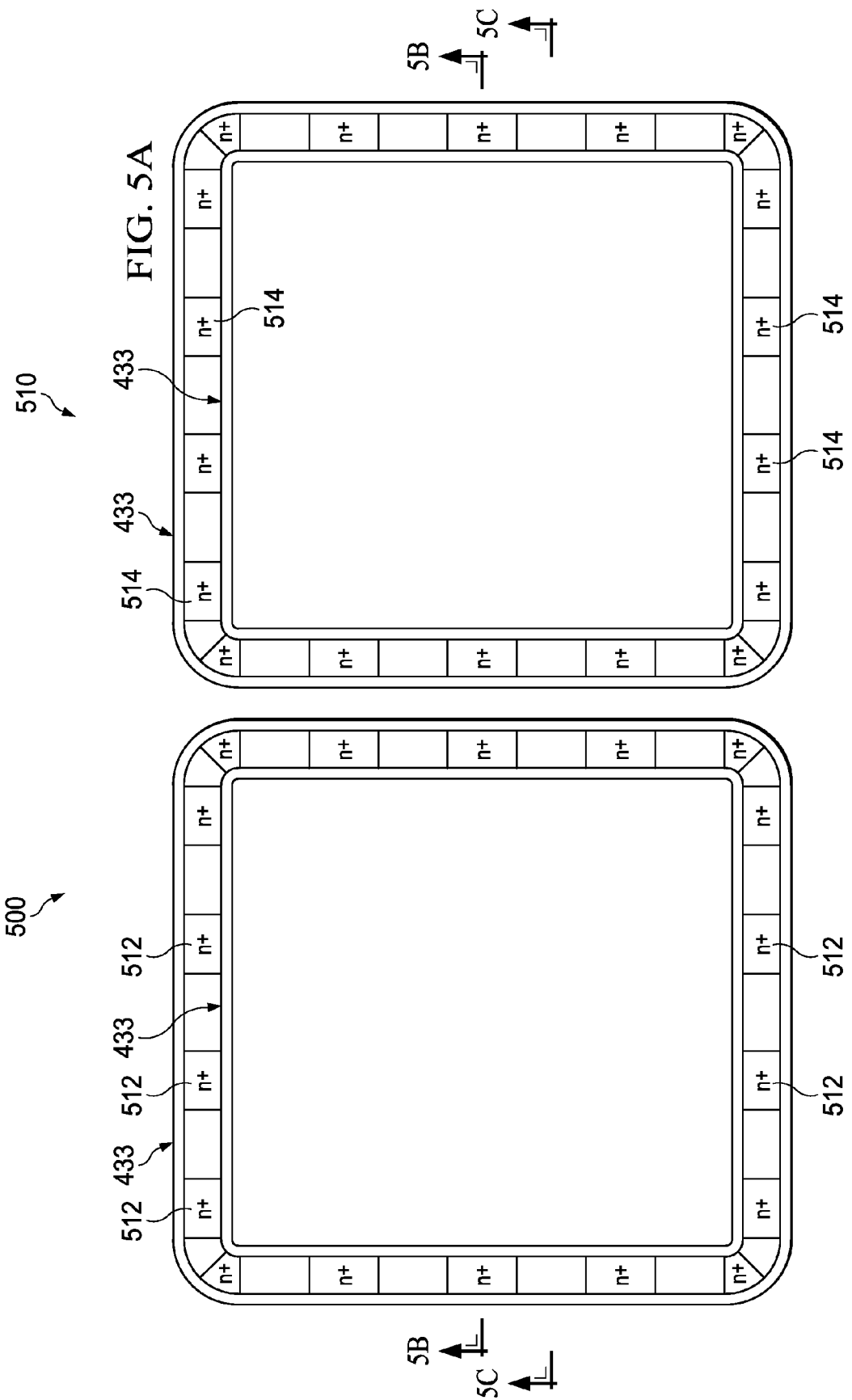

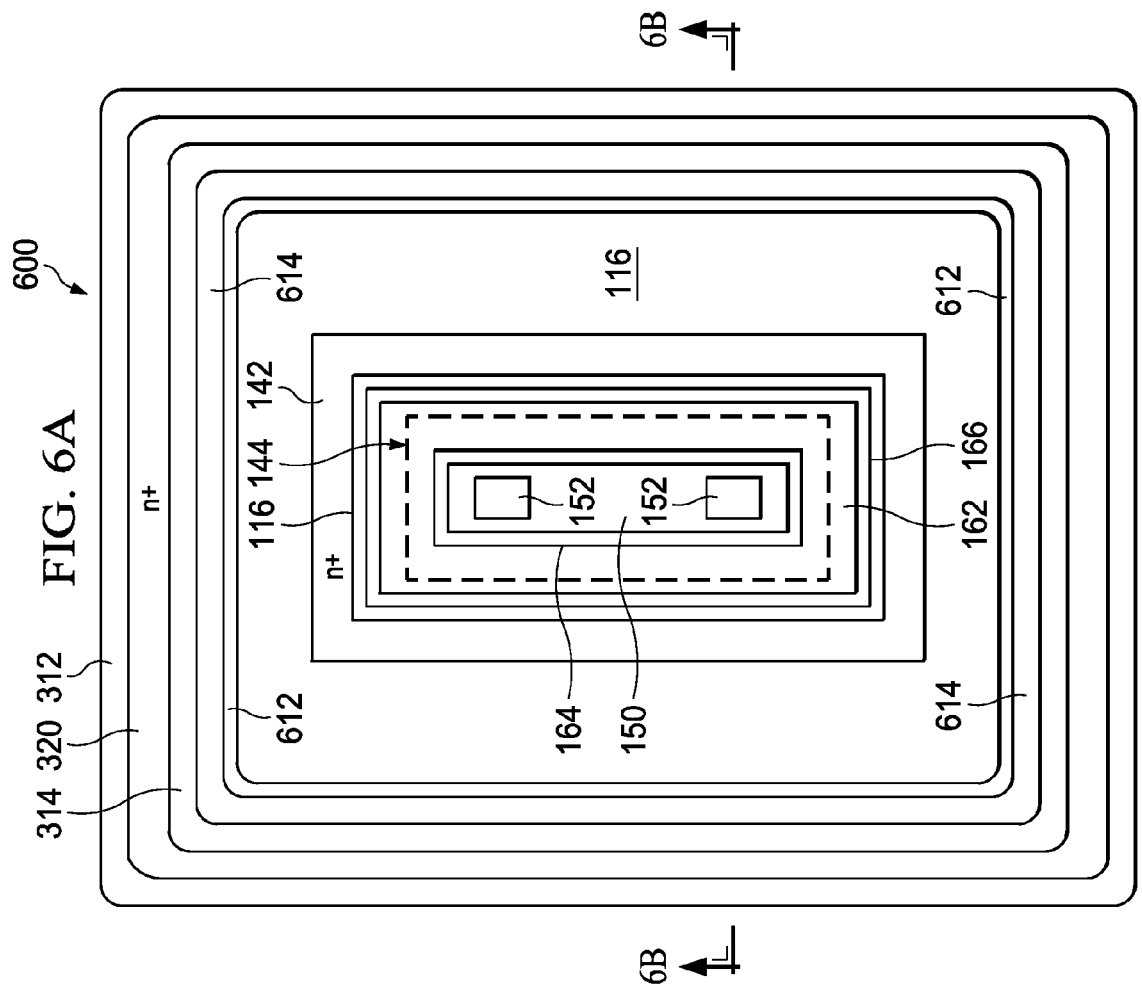

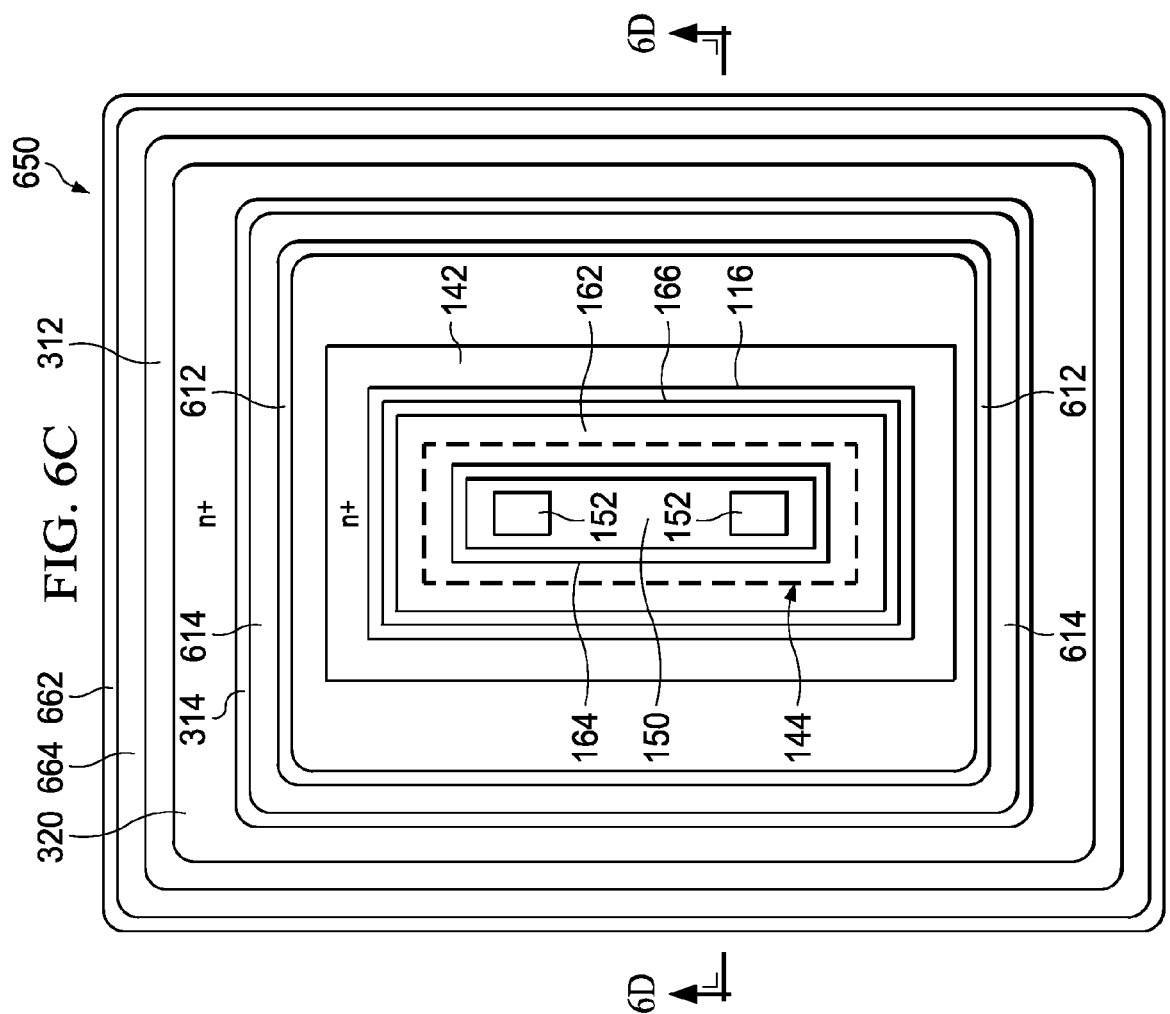

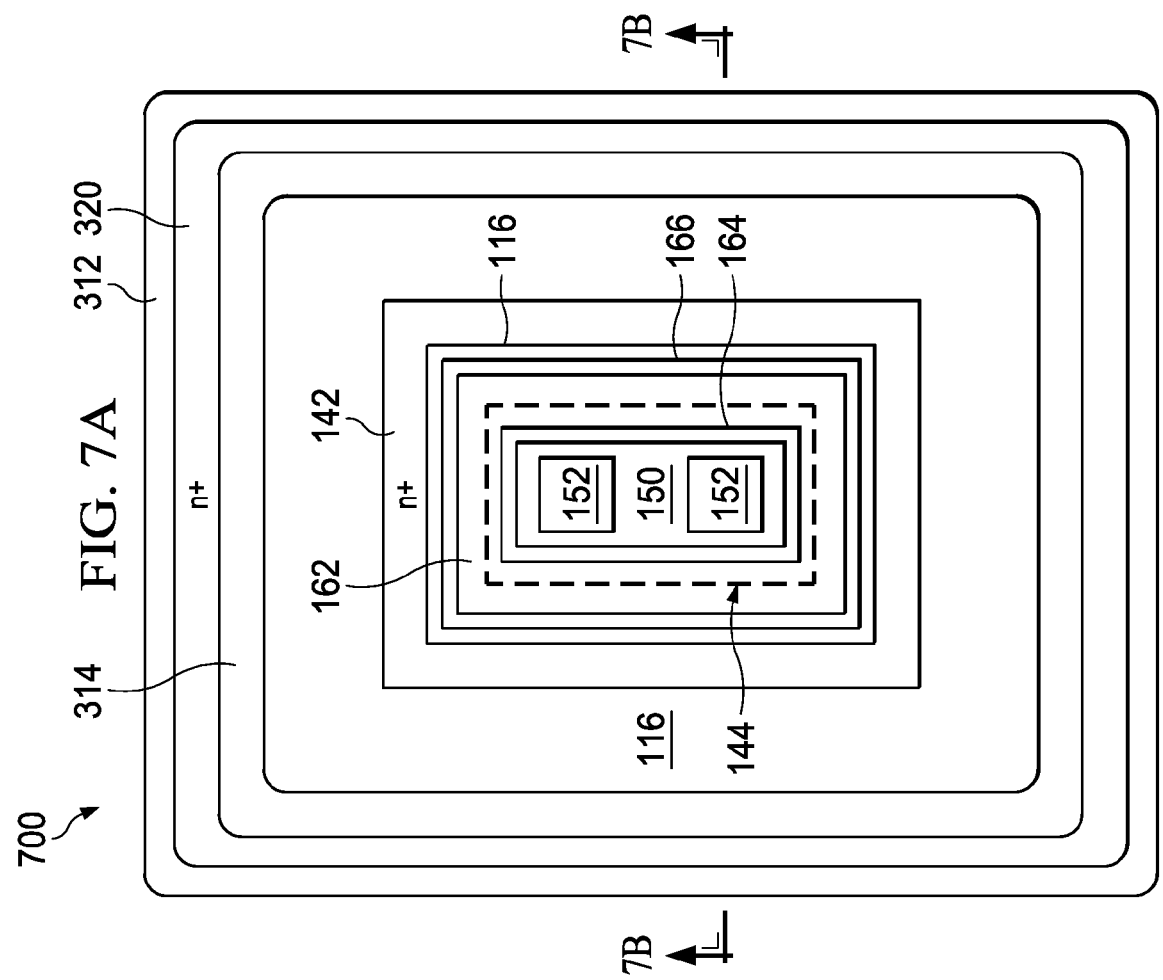

US 9,076,863 B2

SEMICONDUCTOR STRUCTURE WITH A DOPED REGION BETWEEN TWO DEEP TRENCH ISOLATION STRUCTURES

RELATED APPLICATIONS

The present invention is related to application Ser. No. 13/540,542 for "Sinker with a Reduced Width" by Binghua Hu et al filed on Jul. 2, 2012, which is hereby incorporated by reference in its entirety.

BACKGROUND OF THE INVENTION

1. Field of the Invention

The present invention relates to semiconductor structures and, more particularly, to a semiconductor structure and a method of forming the semiconductor structure with deep trench isolation structures.

2. Description of the Related Art

A metal oxide semiconductor (MOS) transistor is a well-known semiconductor device which can be implemented as either an n-channel (NMOS) device or a p-channel (PMOS) device. A MOS transistor has spaced-apart source and drain regions, which are separated by a channel, and a metal gate that lies over the channel. The metal gate is insulated from the channel by a gate dielectric layer. In addition to metal, the gate of a MOS transistor is also commonly formed with doped polysilicon.

A double-diffused MOS (DMOS) transistor is a power MOS transistor that has a double-diffused well that forms the channel, and a large lightly-doped drain region, known as a drain drift region, which lies between the channel and a heavily-doped drain region. A lateral DMOS (LDMOS) transistor is a DMOS transistor where the source and drain regions are laterally spaced apart. A LDMOS array is a group of LDMOS transistors that are arranged in a pattern, typically as an array of rows and columns.

FIGS. 1A-1B show views that illustrates a conventional LDMOS transistor array 100. FIG. 1A shows a plan view, while FIG. 1B shows a cross-sectional view taken along line 1B-1B of FIG. 1A. As shown in FIGS. 1A-1B, LDMOS transistor array 100 includes a semiconductor structure 110 that has a p-type single-crystal-silicon substrate region 112, and a p-type epitaxial layer 114 that is grown over substrate region 112. In addition, semiconductor structure 110 includes a number of shallow trench isolation structures 116 that are formed in the top surface of epitaxial layer 114 to extend down into epitaxial layer 114.

As further shown in FIGS. 1A-1B, LDMOS transistor array 100 also includes a pair of adjacent LDMOS transistors 120 that are formed in epitaxial layer 114. Each LDMOS transistor 120 includes an n− drain drift region 140 that is formed in epitaxial layer 114, and an n+ drain 142 that is formed in n− drain drift region 140.

In addition, each LDMOS transistor 120 includes a double-diffused well (Dwell) 144 that is formed in epitaxial layer 114. Dwell 144, in turn, includes a p-type region 146 and an n-type region 148 that touches p-type region 146. Each LDMOS transistor 120 further includes an n+ source 150 and a p+ contact region 152 that are formed in epitaxial layer 114. N+ source 150 touches p-type region 146 and n-type region 148. P+ contact region 152, which is laterally surrounded by n+ source 150, touches p-type region 146 and n+ source 150.

P-type region 146, which touches n− drain drift region 140, includes a channel region 154 that lies between n− drain drift region 140 and n-type region 148. P-type region 146, which is spaced apart from n+ drain 142, also has a dopant concentration that is greater than a dopant concentration of epitaxial layer 114. In addition, n+ source 150 lies laterally spaced apart from n+ drain 142. Further, n+ drain 142 touches a shallow trench isolation structure 116, which lies laterally between drain 142 and source 150.

As also shown in FIGS. 1A-1B, each LDMOS transistor 120 includes a gate dielectric structure 160 that touches and lies over channel region 154, and a gate 162 that touches gate dielectric structure 160 and lies over channel region 154. Gate 162 has a square-cornered circular shape. In addition, each LDMOS transistor 120 includes an inner sidewall spacer 164 that touches gate 162, and an outer sidewall spacer 166 that touches and laterally surrounds gate 162.

As further shown in FIGS. 1A-1B, semiconductor structure 110 includes a p-type region 170 that is formed in epitaxial layer 114 between the n− drain drift regions 140 of adjacent LDMOS transistors 120 as a channel stopper. Channel stopper region 170 laterally surrounds each of the LDMOS transistors 120.

In operation, when a first positive voltage, such as 40V, is placed on the n+ drain 142 of a LDMOS transistor 120, and ground is placed on p-type region 146 (by way of the p+ contact region 152) and n+ source region 150, the LDMOS transistor 120 turns off when ground is placed on gate 162. In this case, no electrons flow from n+ source 150 to n+ drain 142.

On the other hand, the LDMOS transistor 120 turns on when a second positive voltage, such as $V_{GS} > V_{TH}$, is placed on gate 162 while maintaining the remaining bias conditions. In this case, the channel region 154 of p-type region 146 inverts, and electrons flow from n+ source 150 through channel region 154 to n+ drain 142.

One of the problems with LDMOS transistor array 100 is that the LDMOS transistors 120 in LDMOS transistor array 100 require a large amount of lateral separation, and thereby a large amount of silicon real estate, to provide the necessary electrical isolation. For example, 40V isolation typically requires a minimum lateral spacing S of 5.65 um between the n− drain drift regions 140 of adjacent LDMOS transistors 120.

FIGS. 2A-2B show views that illustrate a conventional LDMOS transistor array 200. FIG. 2A shows a plan view, while FIG. 2B shows a cross-sectional view taken along line 2B-2B of FIG. 2A. LDMOS transistor array 200 is similar to LDMOS transistor array 100 and, as a result, utilizes the same reference numerals to designate the structures that are common to both transistor arrays.

As shown in FIGS. 2A-2B, LDMOS transistor array 200 differs from LDMOS transistor array 100 in that LDMOS transistor array 200 utilizes a semiconductor structure 210 in lieu of semiconductor structure 110. Semiconductor structure 210 is the same as semiconductor structure 110 except that semiconductor structure 210 further includes a number of n+ buried layers 211 that are formed in the top portion of substrate region 112 and the bottom portion of epitaxial layer 114.

Semiconductor structure 210 also differs from semiconductor structure 110 in that semiconductor structure 210 includes a number of n-type junction isolation regions 212 that are formed in epitaxial layer 114. Each junction isolation region 212 includes an n+ bottom region 214 that is formed in epitaxial layer 114 to touch and lie above an n+ buried layer 211. Each junction isolation region 212 additionally includes an n− top region 216 that is formed in epitaxial layer 114 to touch and lie above an n+ bottom region 214, and an n+ contact region 218 that is formed in an n− top region 216.

Semiconductor structure 210 further differs from semiconductor structure 110 in that semiconductor structure 210 includes a number of p-type channel stop regions 220 that are formed in epitaxial layer 114. Each channel stop region 220 lies between an n– drain drift region 140 and a junction isolation region 212.

As further shown in FIGS. 2A-2B, semiconductor structure 210 also includes a p-type well region 222 that is formed in epitaxial layer 114 between the n– top regions 216 of adjacent LDMOS transistors 120 as a channel stopper. LDMOS transistor array 200 additionally includes a p+ contact region 224 that is formed in p-type well region 222.

LDMOS transistor array 200 further includes a p– buried region 226 that is formed in substrate 112 and epitaxial layer 114 to lie laterally between adjacent n+ buried layers 211. P– buried region 226, which has a dopant concentration slightly higher than the dopant concentration of p–type substrate 112, is required to minimize the lateral spacing between adjacent n+ buried layers 211.

LDMOS transistor array 200 operates the same as LDMOS transistor array 100, except that each buried layer 211 and junction isolation region 212 of LDMOS transistor array 200 surrounds and junction isolates a portion of epitaxial layer 114 from the remaining portion of epitaxial layer 114. To support 30V operation and below, p– buried region 226 can touch the adjacent n+ buried layers 211 as shown in FIG. 2B. However, to support 40V operation, p– buried region 226 must be laterally spaced apart from the adjacent n+ buried layers 211 due to the junction breakdown limitations between the n+ buried layers 211 and p– buried layer 226.

Like LDMOS transistor array 100, one of the problems with LDMOS transistor array 200 is that a large amount of silicon real estate is required to provide the necessary electrical isolation. When the dopants that were implanted to form the n+ bottom regions 214 are driven in, the n+ bottom regions 214 experience a substantial lateral diffusion of dopants. Thus, there is a need for an LDMOS transistor array that require less silicon real estate.

SUMMARY OF THE INVENTION

The present invention provides a semiconductor structure that limits the lateral diffusion of dopants and the lateral movement of charge carriers, thereby reducing the required amount of silicon real estate. The semiconductor structure of the present invention includes a substrate and an epitaxial layer. The substrate has a first conductivity type. The substrate also has a top surface. The epitaxial layer has the first conductivity type. The epitaxial layer also has a bottom surface that touches the top surface of the substrate, and a top surface. In addition, the semiconductor structure includes a buried region and a shallow trench isolation region. The buried region has a second conductivity type. The buried region also touches and lies below a portion of the epitaxial layer. The shallow trench isolation structure is formed in the top surface of the epitaxial layer to extend down into the epitaxial layer. Further, the semiconductor structure includes an inner deep trench isolation structure and an outer deep trench isolation structure. The inner deep trench isolation structure is formed in the top surface of the epitaxial layer to extend down into the epitaxial layer. In addition, the inner deep trench isolation structure laterally surrounds the shallow trench isolation structure. The outer deep trench isolation structure is formed in the top surface of the epitaxial layer to extend down into the epitaxial layer. In addition, the outer deep trench isolation structure laterally surrounds the inner deep trench isolation structure. The semiconductor structure further includes a doped region that is formed in the top surface of the epitaxial layer to extend down into the epitaxial layer and touch the buried region. The doped region has the second conductivity type. The doped region also touches the inner and outer deep trench isolation structures, and laterally surrounds the portion of the epitaxial layer.

The present invention also provides a transistor array. The transistor array includes a semiconductor material that has a first conductivity type. In addition, the transistor array includes two or more transistor structures. Each transistor structure has a source and a drain formed in the semiconductor material. The source and drain have a second conductivity type. The drain is laterally spaced apart from the source. Further, each transistor structure has a shallow trench isolation structure that is formed in the semiconductor material. The shallow trench isolation structure touches the drain. The transistor array additionally includes a deep isolation structure that is formed in the semiconductor material. The deep isolation structure laterally surrounds the source and the drain of a transistor structure in the array.

The present invention further provides a method of forming a semiconductor structure that limits the lateral diffusion of dopants and the lateral movement of charge carriers. The method of the present invention includes forming a buried region in a substrate. The substrate has a first conductivity type. The buried region has a second conductivity type. The method also includes growing an epitaxial layer on the substrate. The epitaxial layer has a top surface and the first conductivity type. The buried region touches and lies below a portion of the epitaxial layer. Further, the method includes forming a shallow trench isolation structure in the top surface of the epitaxial layer to extend down into the epitaxial layer. The method additionally includes forming an inner deep trench isolation structure in the top surface of the epitaxial layer to extend down into the epitaxial layer. The inner deep trench isolation structure laterally surrounds the shallow trench isolation structure. The method further includes forming an outer deep trench isolation structure in the top surface of the epitaxial layer to extend down into the epitaxial layer. The outer deep trench isolation structure laterally surrounds the inner deep trench isolation structure. In addition, the method includes forming a doped region in the top surface of the epitaxial layer to extend down into the epitaxial layer and touch the buried region. The doped region has the second conductivity type. The doped region also touches the inner and outer deep trench isolation structures, and laterally surrounds the portion of the epitaxial layer.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 1A is a plan view. FIG. 1B is a cross-sectional view taken along line 1B-1B of FIG. 1A.

FIG. 2A is a plan view. FIG. 2B is a cross-sectional view taken along line 2B-2B of FIG. 2A.

FIG. 3A is a plan view. FIG. 3B is a cross-sectional view taken along line 3B-3B of FIG. 3A.

FIGS. 4A-4M are cross-sectional views illustrating an example of a method 400 of forming a LDMOS transistor array in accordance with the present invention.

FIGS. 5A-5C are views illustrating an example of a method 500 of forming a LDMOS transistor array in accordance with an alternate embodiment of the present invention. FIG. 5A is a plan view. FIG. 5B is a cross-sectional view taken along line 5B-5B of FIG. 5A. FIG. 5C is a cross-sectional view taken along line 5C-5C of FIG. 5A.

FIGS. 6A-6B are views illustrating an example of a LDMOS transistor array 600 in accordance with an alternate embodiment of the present invention. FIG. 6A is a plan view. FIG. 6B is a cross-sectional view taken along line 6B-6B of FIG. 6A.

FIGS. 6C-6D are views illustrating an example of a LDMOS transistor array 650 in accordance with an alternate embodiment of the present invention. FIG. 6C is a plan view. FIG. 6D is a cross-sectional view taken along line 6D-6D of FIG. 6C.

FIGS. 7A-7B are views illustrating an example of a LDMOS transistor array 700 in accordance with an alternate embodiment of the present invention. FIG. 7A is a plan view. FIG. 7B is a cross-sectional view taken along line 7B-7B of FIG. 7A.

FIG. 8A is a plan view. FIG. 8B is a cross-sectional view taken along line 8B-8B of FIG. 8A.

DETAILED DESCRIPTION OF THE INVENTION

Figure 1A:
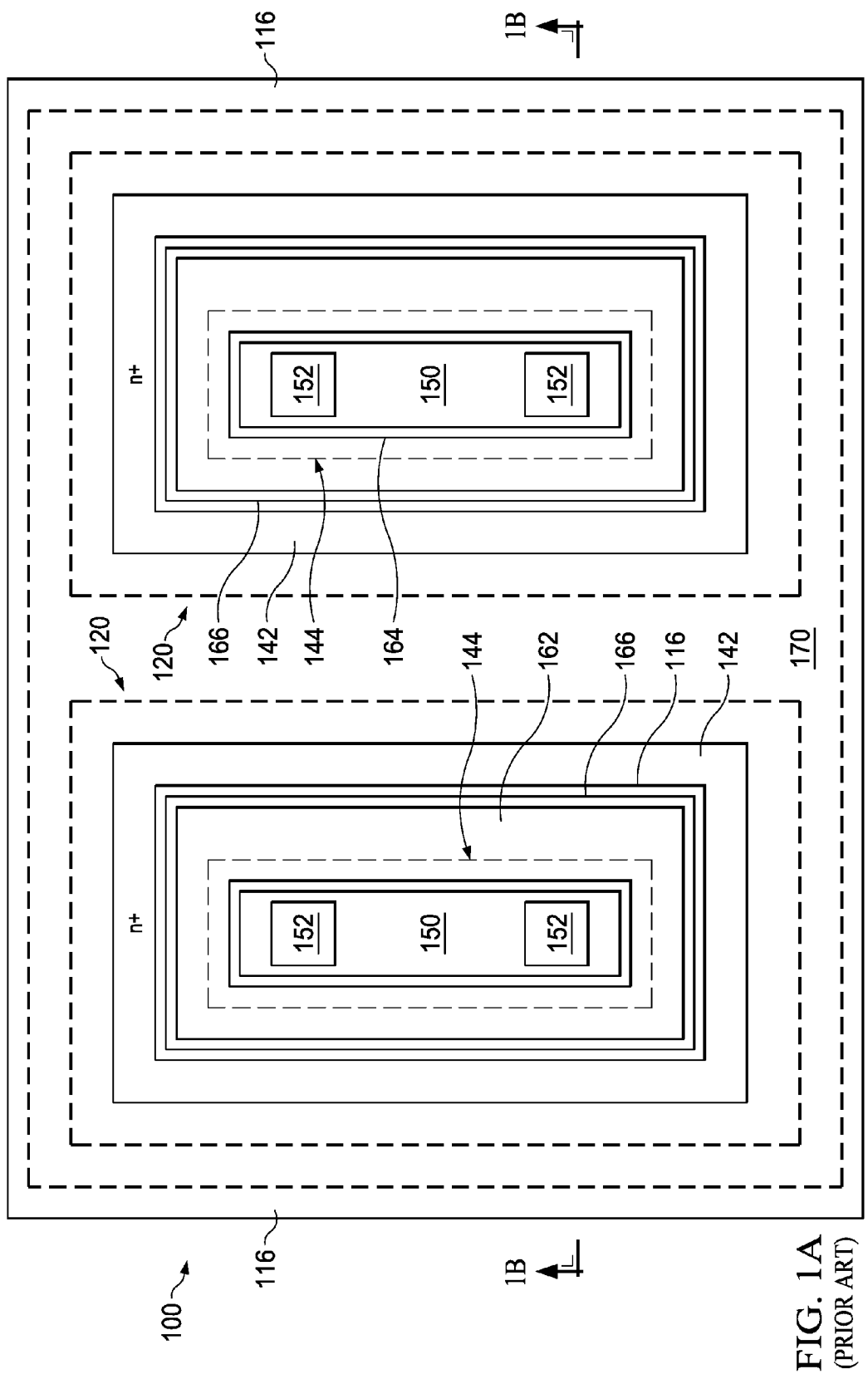
FIGS. 1A-1B are views illustrating a conventional LDMOS transistor array 100.
Figure 1B:
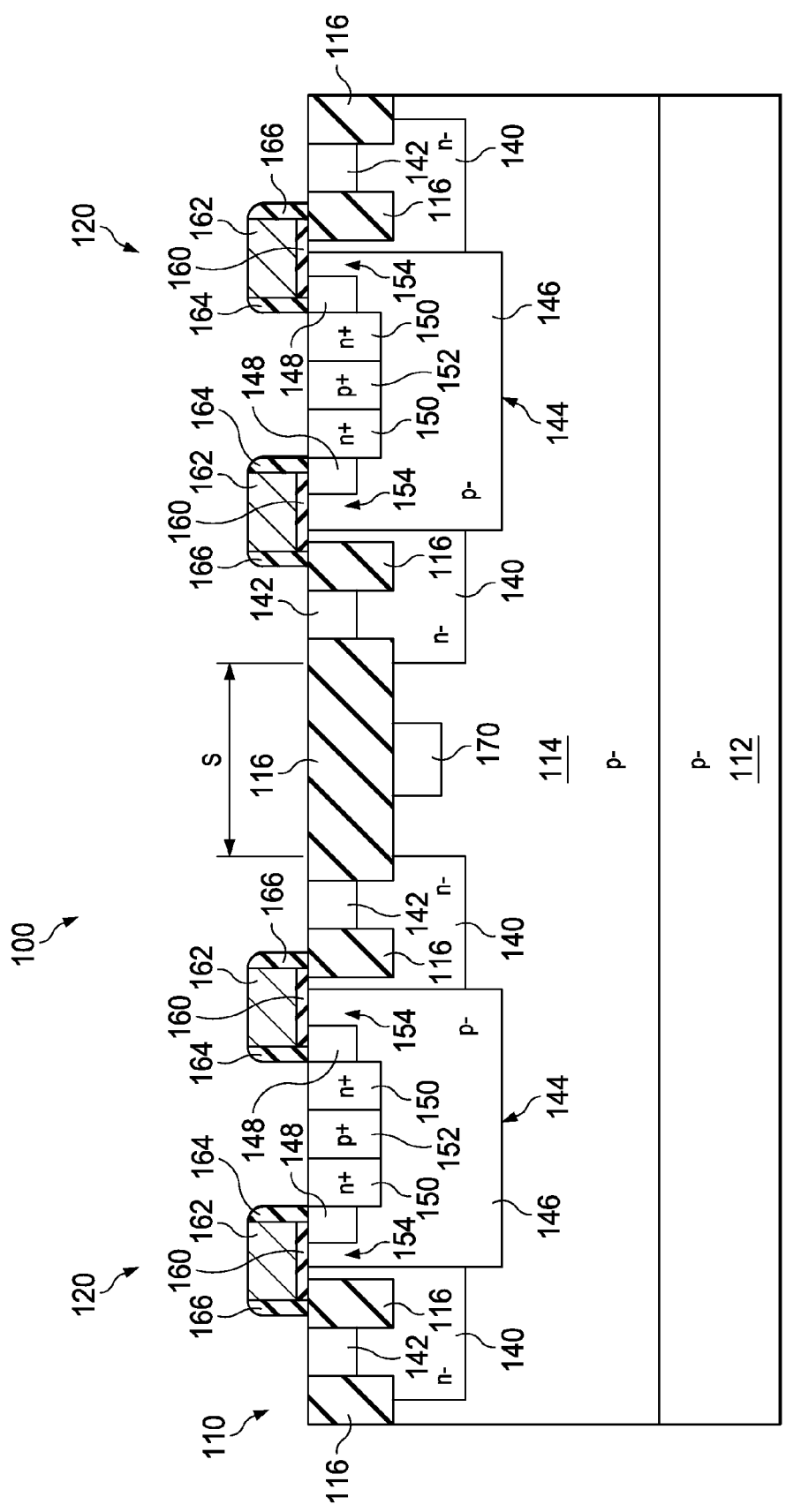
Figure 2A:
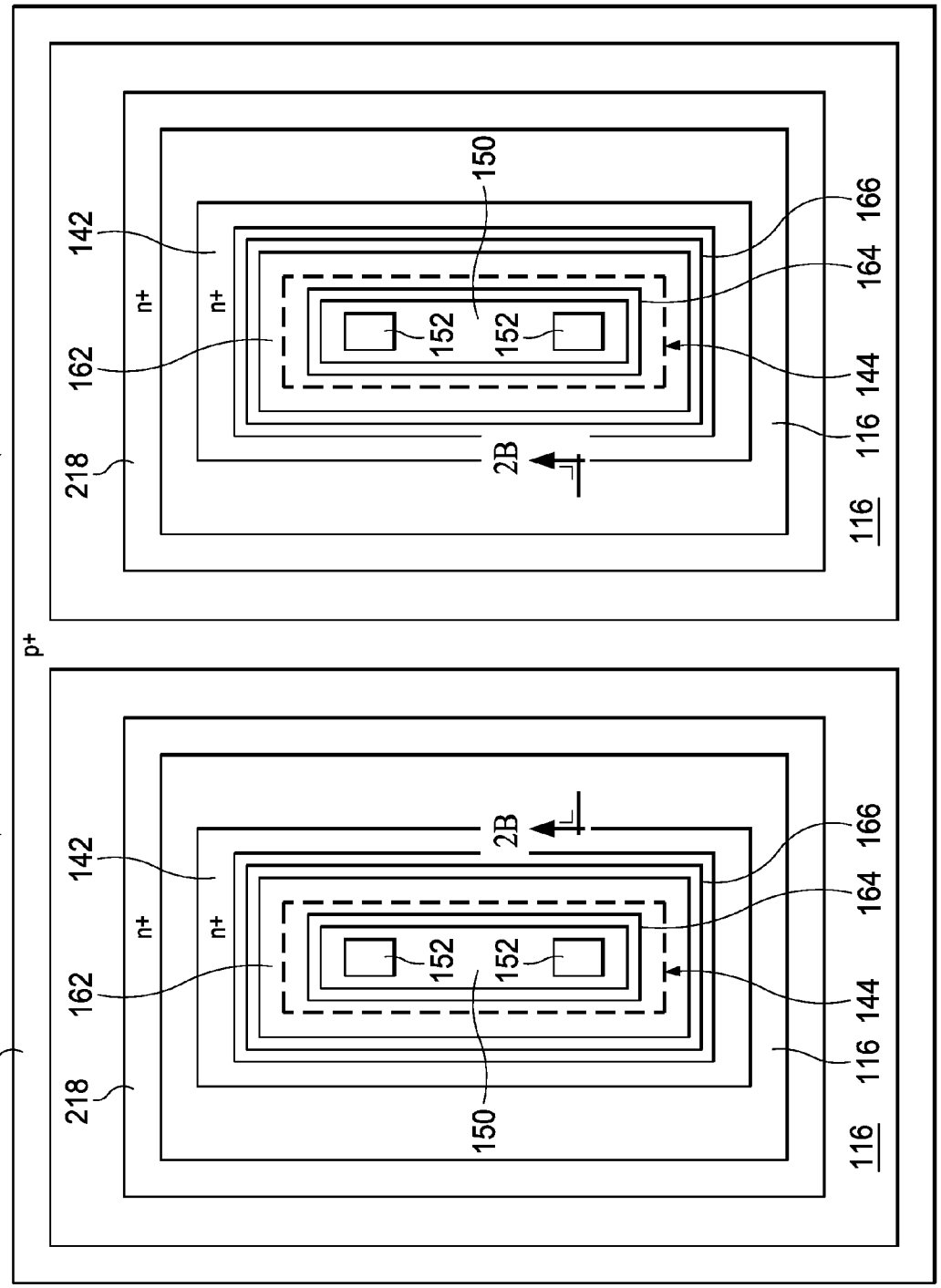
FIGS. 2A-2B are views illustrating a conventional LDMOS transistor array 200.
Figure 2B:
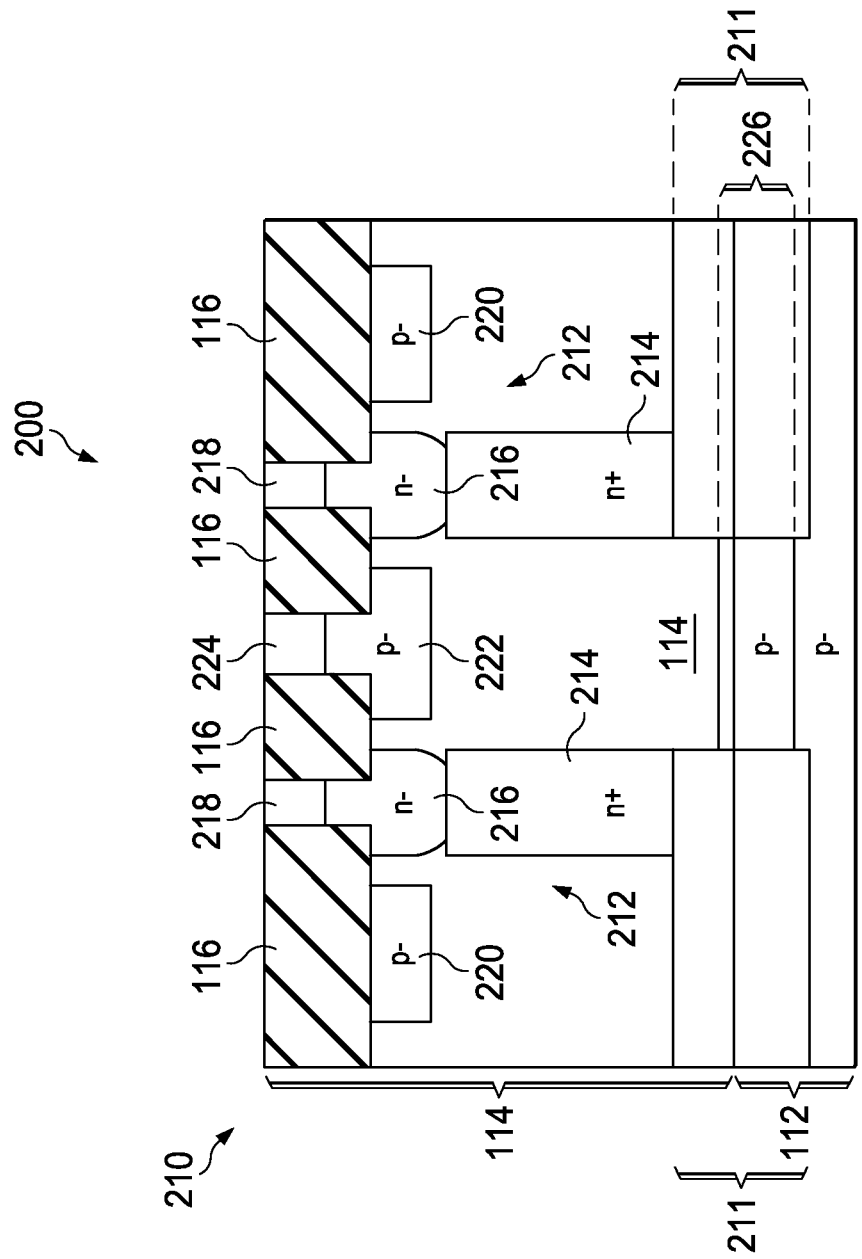
Figure 3A:
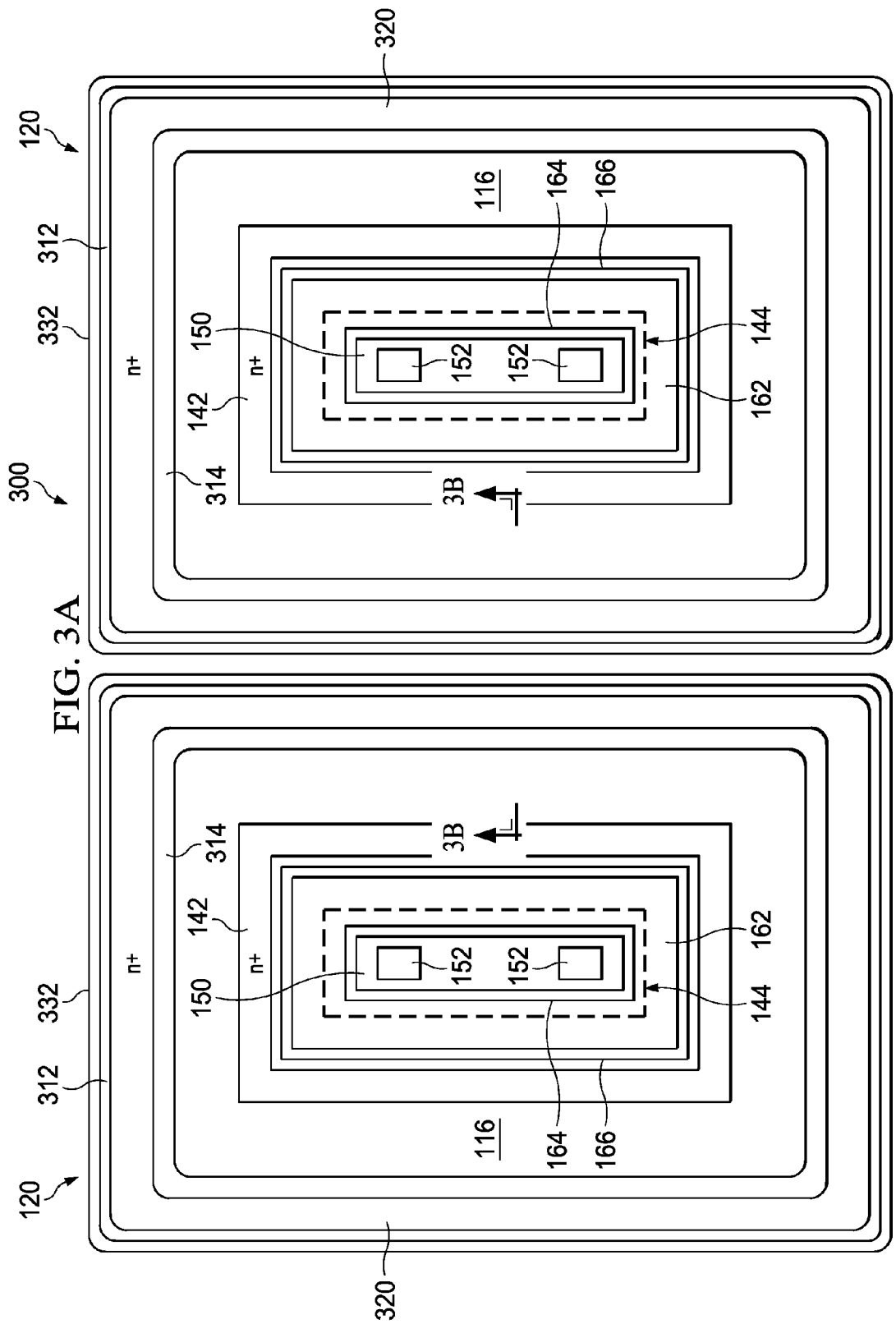
FIGS. 3A-3B are views illustrating an example of a LDMOS transistor array 300 in accordance with the present invention.
Figure 3B:
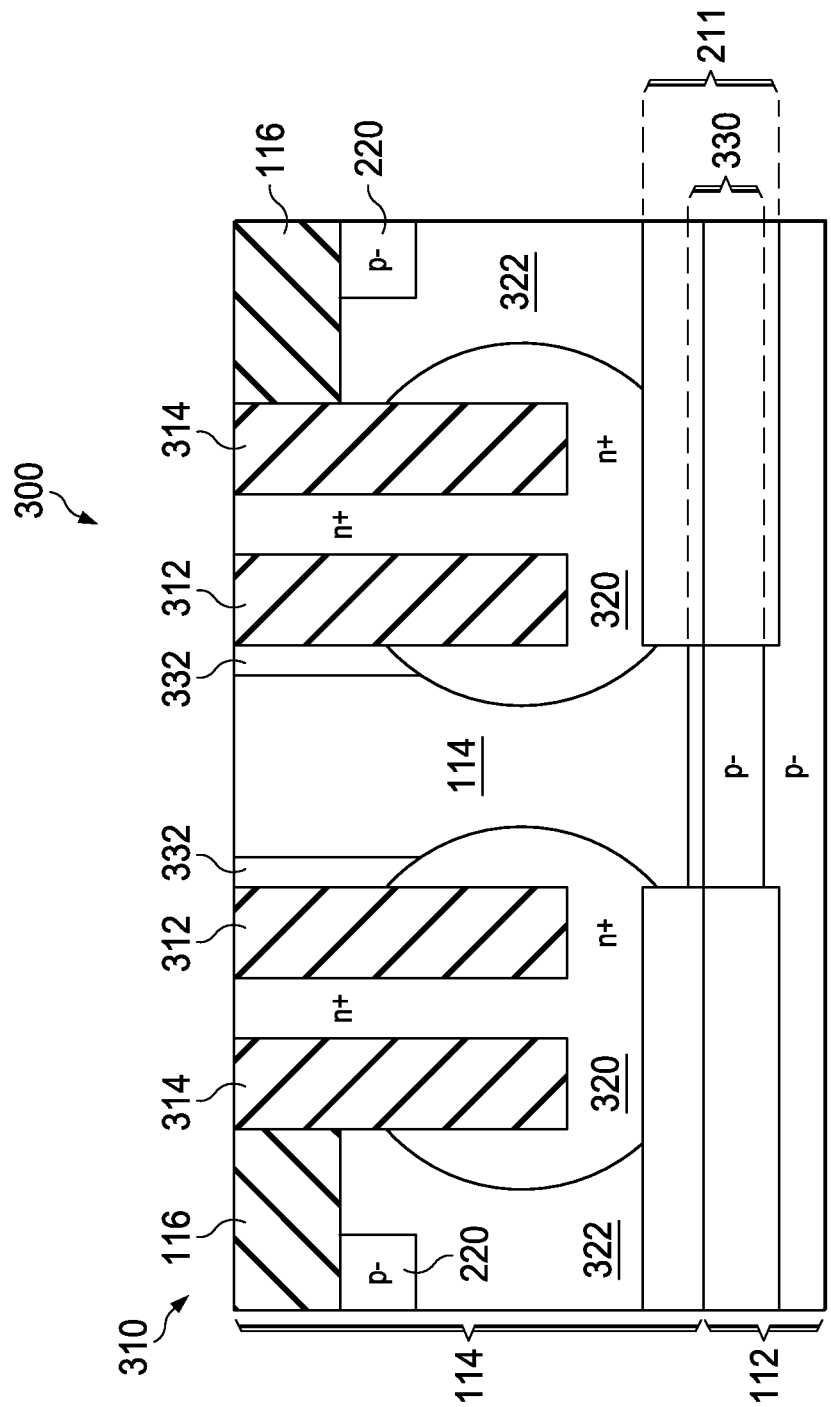

FIGS. 3A-3B show views that illustrate an example of a LDMOS transistor array 300 in accordance with the present invention. FIG. 3A shows a plan view, while FIG. 3B shows a cross-sectional view taken along line 3B-3B of FIG. 3A. As described in greater detail below, LDMOS transistor 300 requires less silicon real estate than a conventional LDMOS transistor.

LDMOS transistor array 300 is similar to LDMOS transistor array 200 and, as a result, utilizes the same reference numerals to designate the structures that are common to both transistors. As shown in FIGS. 3A-3B, LDMOS transistor array 300 differs from LDMOS transistor array 200 in that LDMOS transistor array 300 utilizes a semiconductor structure 310 in lieu of semiconductor structure 210.

Semiconductor structure 310, in turn, is the same as semiconductor structure 210 except that semiconductor structure 310 also includes a number of outer deep trench isolation structures 312 and a number of inner deep trench isolation structures 314 that are formed in the top surface of epitaxial layer 114 to extend down into epitaxial layer 114. The outer and inner deep trench isolation structures 312 and 314 have depths that are substantially deeper than the depths of the shallow trench isolation structures 116. In addition, as shown in FIG. 3A, the outer and inner deep trench isolation structures 312 and 314 have round corners. The round corners minimize the stress from the outer and inner deep trench isolation structures 312 and 314.

Semiconductor structure 310 also differs from semiconductor structure 210 in that semiconductor structure 310 utilizes a number of n-type junction isolation regions 320 in lieu of the junction isolation regions 212. In the present example, the junction isolation regions 320 differ from the junction isolation regions 212 in that each junction isolation region 320 utilizes a single n+ region in lieu of n+ bottom region 214, n− top region 216, and n+ contact region 218. Each junction isolation region 320 touches and lies between a pair of outer and inner deep trench isolation structures 312 and 314.

Each buried layer 211 touches and lies below one of a number of portions 322 of epitaxial layer 114, where each portion 322 includes drain drift region 140, Dwell 144, and a number of shallow trench isolation structures 116. Further, each junction isolation region 320, which touches a buried layer 211, laterally surrounds the portion 322 of epitaxial layer 114. As a result, an n-type region, which includes buried layer 211 and junction isolation region 320, lies completely between the portion 322 of epitaxial layer 114 and a remaining portion of the epitaxial layer 114.

Further, outer deep trench isolation structure 312 laterally surrounds the portion 322 of epitaxial layer 114 and inner deep trench isolation structure 314. Inner deep trench isolation structure 314, in turn, laterally surrounds a number of shallow trench isolation structures 116. As additionally shown in FIGS. 3A-3B, adjacent junction isolation regions 320 are laterally spaced apart from each other by a portion of p-type epitaxial layer 114.

LDMOS transistor array 300 also includes a p− buried region 330 that is formed in substrate 112 and epitaxial layer 114 to lie laterally between adjacent n+ buried layers 211. P− buried region 330 has a dopant concentration slightly higher than the dopant concentration of p-type substrate 112. In addition, p− buried region 330 can touch the adjacent n+ buried layers 211 as shown in FIG. 3B for 40V operation and below.

As further shown in FIGS. 3A-3B, transistor array 300 can optionally include a number of n− interface regions 332 that are formed in epitaxial layer 114 so that each n− interface region 332 laterally surrounds an outer deep trench isolation structures 312. The n− interface regions 332, which each has a dopant concentration that is lower than the dopant concentration of n-type junction isolation region 320, maybe required for 40V operation and to avoid hot carrier trapping at the interface between silicon and oxide. LDMOS transistor array 300 operates the same as LDMOS transistor array 200 except that LDMOS transistor array 300 provides greater lateral isolation than LDMOS transistor array 200.

As further shown in FIG. 3B, the portions of the junction isolation regions 320 that lie below the outer and inner deep trench isolation structures 312 and 314 could be wider than the portion of the junction isolation regions 320 which lie between the outer and inner deep trench isolation structures 312 and 314. Although the outer and inner deep trench isolation structures 312 and 314 may not eliminate the lateral diffusion of dopants, the outer and inner deep trench isolation structures 312 and 314 substantially suppress the lateral diffusion of dopants.

As a result, the minimum lateral spacing between adjacent LDMOS transistors 120 in array 300 is substantially less than the minimum lateral spacing between adjacent LDMOS transistors 120 in array 200. For example, 20V isolation for adjacent LDMOS transistors 120 in array 200 typically requires a minimum lateral spacing of 7 um, whereas 20V isolation for adjacent LDMOS transistors 120 in array 300 can utilize a minimum lateral spacing of 5.2 um, which is a 26% reduction.

Similarly, 30V isolation for adjacent LDMOS transistors 120 in array 200 typically requires a minimum lateral spacing of 8 um, whereas 30V isolation for adjacent LDMOS transistors 120 in array 300 can utilize a minimum lateral spacing of 5.7 um, which is a 29% reduction. Further, 40V isolation for adjacent LDMOS transistors 120 in array 200 typically requires a minimum lateral spacing of 8.5 um, whereas 40V isolation for adjacent LDMOS transistors 120 in array 300 can utilize a minimum lateral spacing of 6.2 um, which is a 27% reduction.

Thus, one of the advantages of the present invention is that by suppressing the lateral diffusion of dopants, the outer and inner deep trench isolation structures 312 and 314 substantially reduce the minimum lateral spacing between adjacent LDMOS transistors 120 in array 300, thereby substantially reducing the silicon real estate required to implement LDMOS transistor array 300.

Figure 4B:
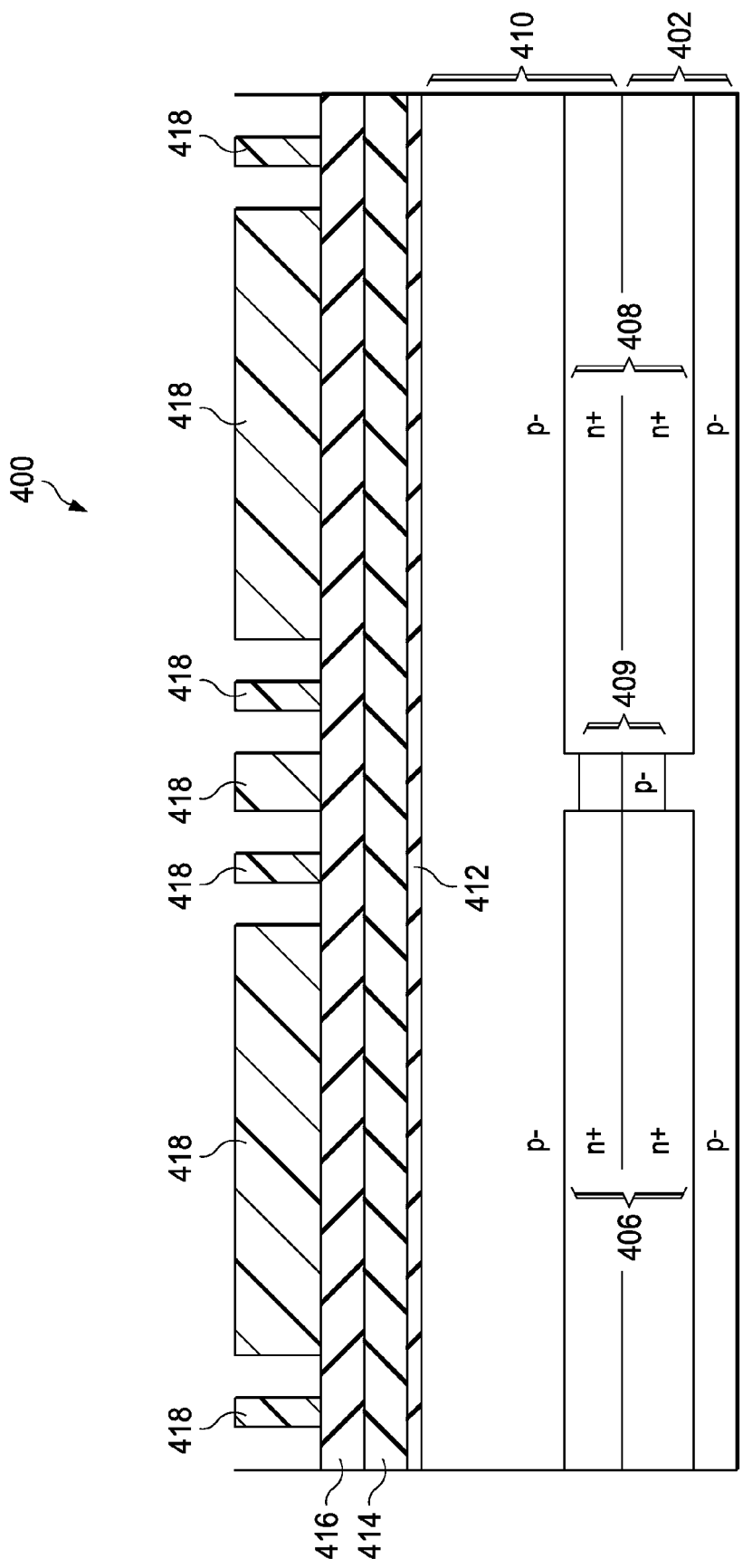

FIGS. 4A-4M show cross-sectional views that illustrate an example of a method 400 of forming a LDMOS transistor array in accordance with the present invention. As shown in FIG. 4A, method 400 utilizes a conventionally-formed p-type single-crystal-silicon substrate 402, and begins by forming a patterned photoresist layer 404 on the top surface of substrate 402.

Patterned photoresist layer 404 is formed in a conventional manner, which includes depositing a layer of photoresist, projecting a light through a patterned black/clear glass plate known as a mask to form a patterned image on the layer of photoresist, and removing the imaged photoresist regions which were softened by exposure to the light.

After patterned photoresist layer 404 has been formed, the exposed regions of substrate 402 are implanted with an n-type dopant, such as antimony, to form laterally spaced-apart n+ buried regions 406 and 408 in the top surface of substrate 402. Antimony has a small diffusion coefficient which minimizes the upward diffusion of the dopant into a subsequently-formed epitaxial layer. After the n+ buried regions 406 and 408 have been formed, patterned photoresist layer 404 is removed in a conventional manner, such as with an ash process.

As shown in FIG. 4B, after patterned photoresist layer 404 has been removed, substrate 402 is blanket implanted with a p-type dopant, such as boron, at an implant energy of 1700 KeV. The implant forms a p– buried region 409 in the top surface of substrate 402 between the laterally spaced-apart n+ buried regions 406 and 408. The dopant concentration of p– buried region 409 is slightly higher than the dopant concentration of p-substrate 402. As a result, the implant has substantially no effect on the profile of the n+ buried regions 406 and 408. The p-type blanket implant is sufficient for 40V operation and below.

Once p– buried region 409 has been formed, the resulting structure is conventionally annealed at 1200° C. to drive in the implants. The drive in causes the n+ buried regions 706 and 708 and p– buried region 409 to diffuse downward, which limits the upward diffusion of the n+ buried regions 406 and 408 and p– buried region 409 into the subsequently-formed epitaxial layer.

In addition, the drive-in causes the n+ buried regions 406 and 408 and p– buried region 409 in substrate 402 to be thicker than the n+ buried regions 406 and 408 and p– buried region 409 in the subsequently-formed epitaxial layer. Since the dose of the p-type implant is much lower than the dose of the n-type implant, the thickness of p– buried region 409 is thinner than the thicknesses of the n+ buried regions 706 and 708.

Following the drive in, a p-type epitaxial layer 410 is grown on the top surface of substrate 402 in a conventional fashion. During the formation of epitaxial layer 410, the n+ buried regions 406 and 408 and the p– buried region 409 diffuse upward into the bottom portion of epitaxial layer 410.

The upward diffusion of the n+ buried regions 406 and 408 during the formation of epitaxial layer 410 is much greater than the upward diffusion of p– buried region 409. This is because the projected range of the implant used to form p– buried region 409 is very big, and the dose used to form p– buried region 409 is much lower than the dose used to form the n+ buried regions 406 and 408. As a result, a large portion of p– buried region 409 exists in p-type substrate 402.

Once epitaxial layer 410 has been formed, a hard mask is formed on the top surface of epitaxial layer 410. In the present example, the hard mask is formed by depositing an oxide layer 412 on epitaxial layer 410. Following this, a nitride layer 414 is deposited on oxide layer 412, and an oxide layer 416 is deposited on nitride layer 414.

Oxide layer 412, nitride layer 414, and oxide layer 416 can each have a range of thicknesses. In the present example, oxide layer 412 has a thickness of approximately 150 Å, nitride layer 414 has a thickness of approximately 2000 Å, and oxide layer 416 has a thickness of approximately 3000 Å. Further, oxide layer 412 can be implemented with thermally grown oxide, while oxide layer 416 can be implemented with any kind of deposited silicon dioxide ($SiO_2$) layer. Next, a patterned photoresist layer 418 approximately 1 μm thick is formed on the top surface of oxide layer 416. Patterned photoresist layer 418 is formed in a conventional manner to have round corners (when seen in a plan view).

Figure 4C:
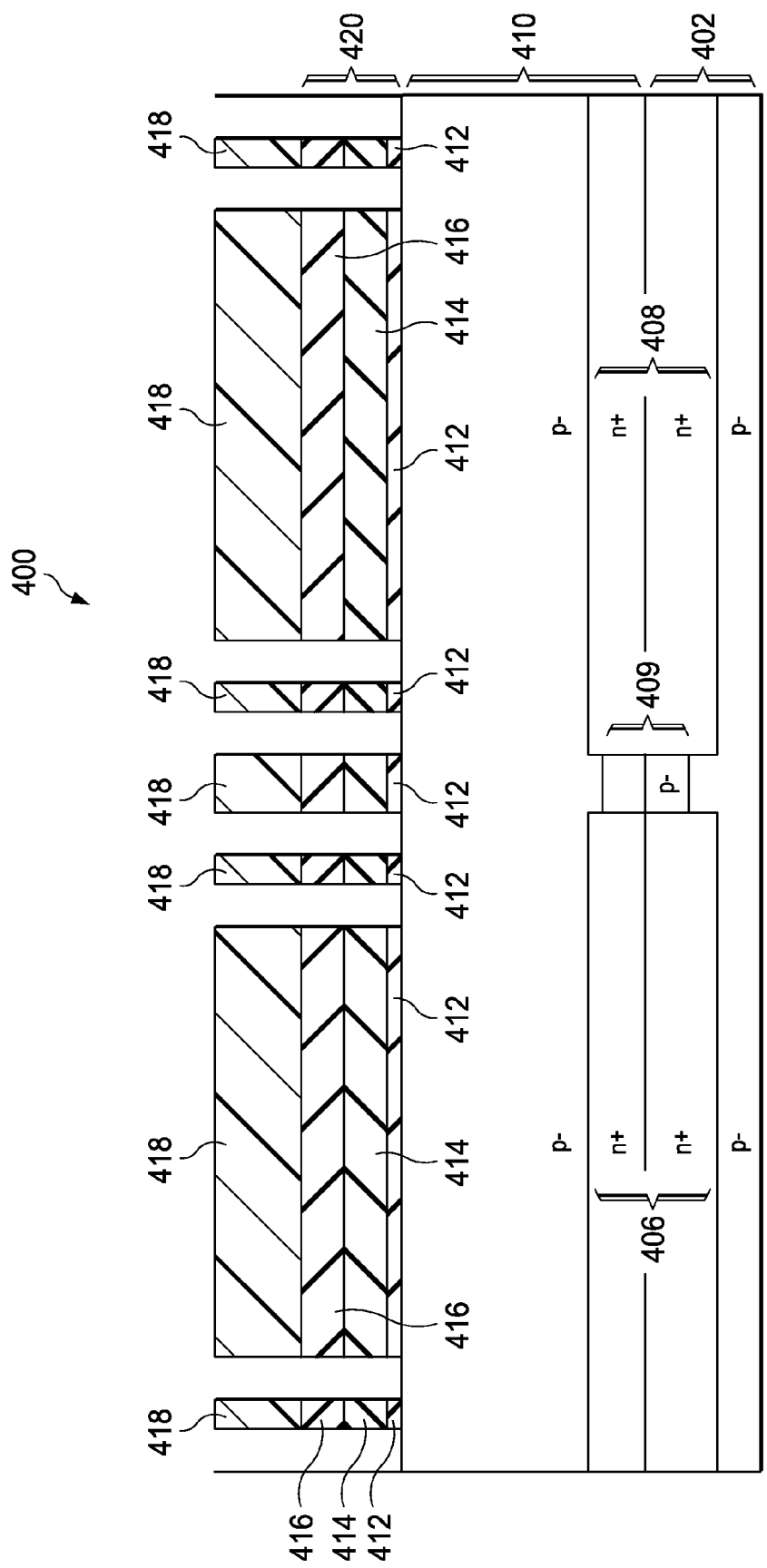

As shown in FIG. 4C, after patterned photoresist layer 418 has been formed, the exposed regions of oxide layer 416 and the underlying regions of nitride layer 414 and oxide layer 412 are etched to form a hard mask 420, which has round corners (when seen in a plan view) and a number of openings that extend completely through hard mask 420. After hard mask 420 has been formed, patterned photoresist layer 418 is removed in a conventional manner.

Figure 4D:
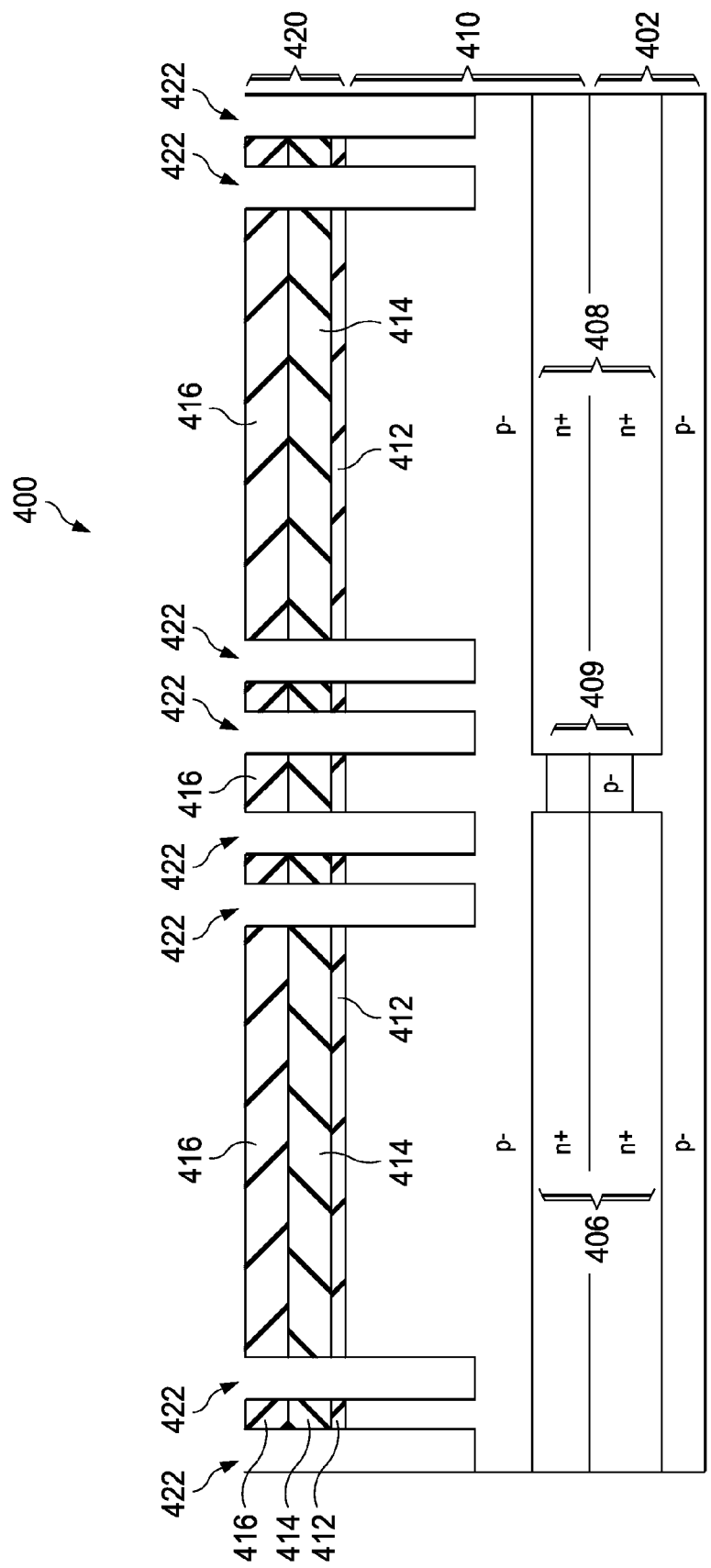

As shown in FIG. 4D, following the removal of patterned photoresist layer 418, epitaxial layer 410 is etched through the openings in hard mask 420 to form a number of trench openings 422 in epitaxial layer 410. The trench openings 422 can have a range of widths and depths. In the present example, each trench opening 422 has a width of 0.7 μm and a depth of 2.5 μm.

In addition, the trench openings 422 have side walls which can have a range of side wall angles, where a 90° side wall angle is substantially perpendicular to the top surface of epitaxial layer 410. In the present example, each trench opening 422 has a side wall angle of 88°. Further, the trench openings 422 have round corners (when viewed from above).

Figure 4E:
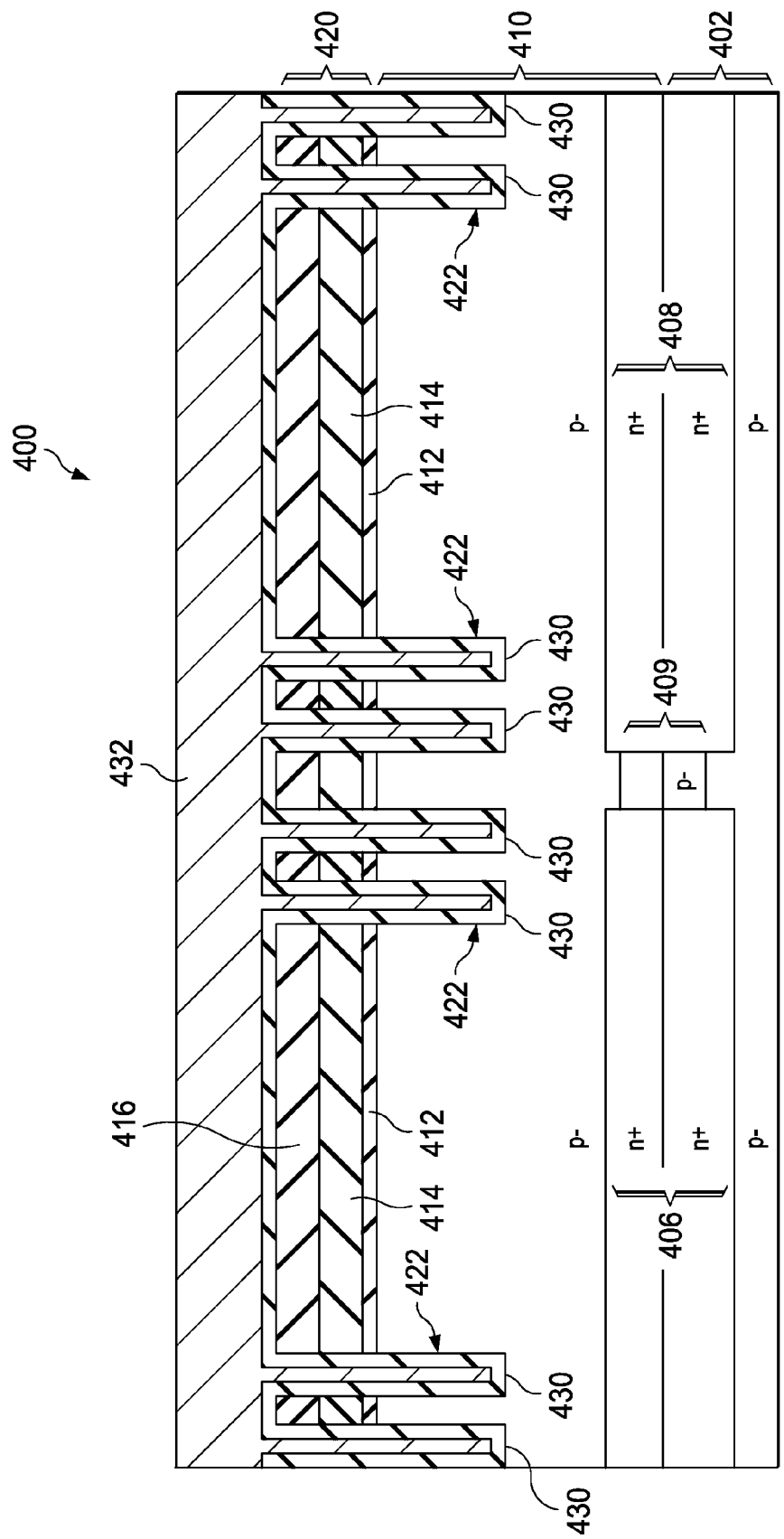

As shown in FIG. 4E, after the trench openings 422 have been formed, a non-conductive liner 430 is conformally formed on hard mask 420 and the exposed regions of the epitaxial layer 410 to line the trench openings 422. For example, liner 430 can be formed by thermally growing oxide to a depth of approximately 200 Å, followed by the deposition of an oxide layer to a depth of approximately 2000 Å using sub-atmospheric pressure chemical vapor deposition (SACVD).

Next, after non-conductive liner 430 has been formed, a conductive layer 432 is deposited on non-conductive liner 430 to fill the remainder of the trench openings 422. In the present example, conductive layer 432 is formed by conventionally depositing a polysilicon layer on non-conductive liner 430 to fill the remainder of the trench openings 422. The polysilicon layer can be in-situ doped or implanted with a dopant after deposition in a conventional manner. In the present example, the polysilicon layer is doped to have an n conductivity type.

Figure 4F:
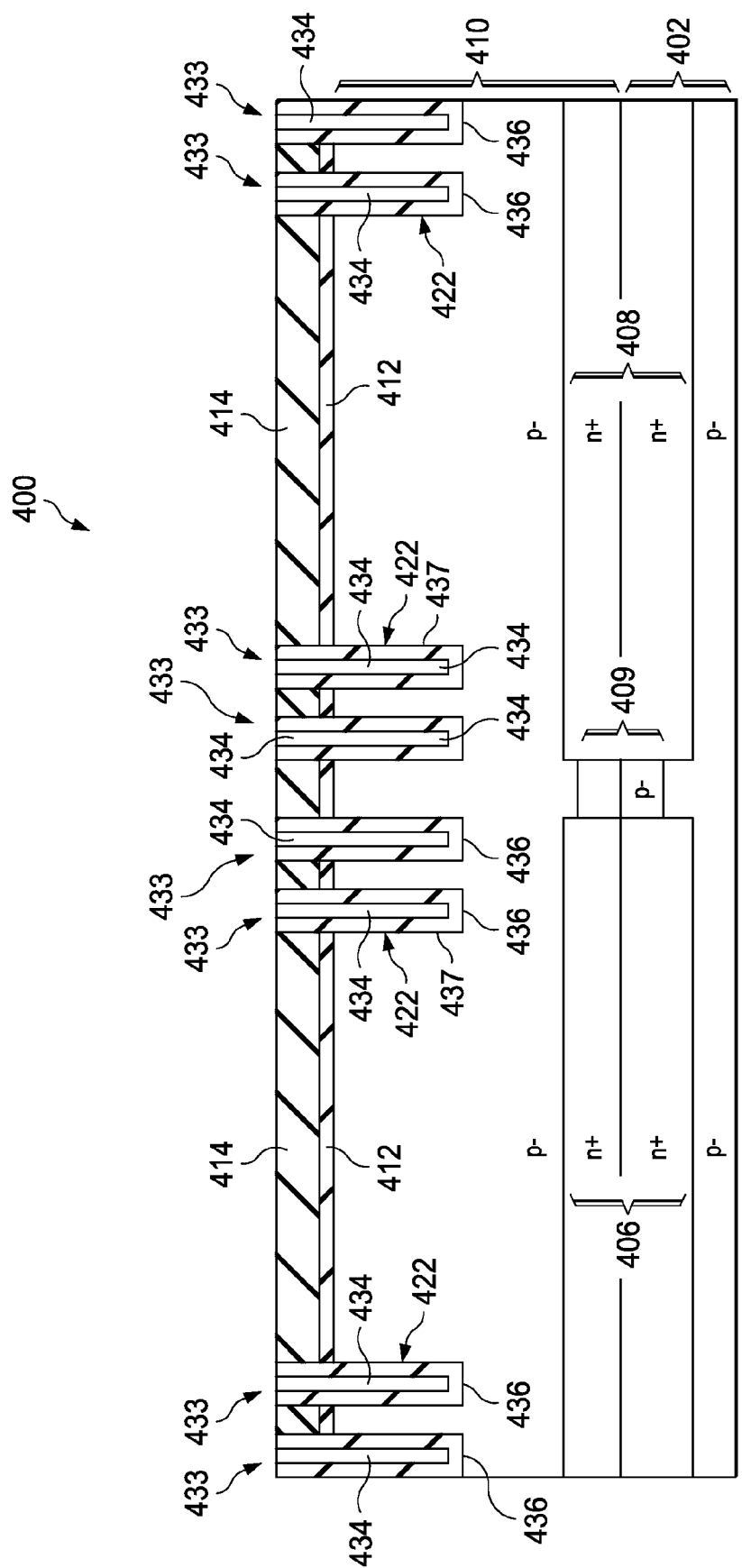

Following this, as shown in FIG. 4F, conductive layer 432, non-conductive liner 430, and oxide layer 416 are planarized in a conventional manner, such as with an etch back or chemical-mechanical polishing. The planarization continues until oxide layer 416 has been removed from the top surface of nitride layer 414 to form a number of deep trench isolation structures 433 that fill the trench openings 422. The deep trench isolation structures 433 have round corners (when viewed from above) as a result of the round corners of the trench openings 422.

Thus, in the present example, each trench isolation structure 433 has a polysilicon core 434 and a non-conductive outer structure 436. Non-conductive outer structure 436, in turn, has a non-conductive outer surface 437 that touches the epitaxial layer 410 which is exposed by a trench opening 422.

Alternately, rather than implementing the deep trench isolation structures 433 with polysilicon core 434 and non-conductive outer structure 436, the deep trench isolation structures 433 can be implemented with only a non-conductive material. In this case, rather than lining the trench openings 422 with a non-conductive material, the trench openings 422 are filled with the non-conductive material.

Figure 4G:
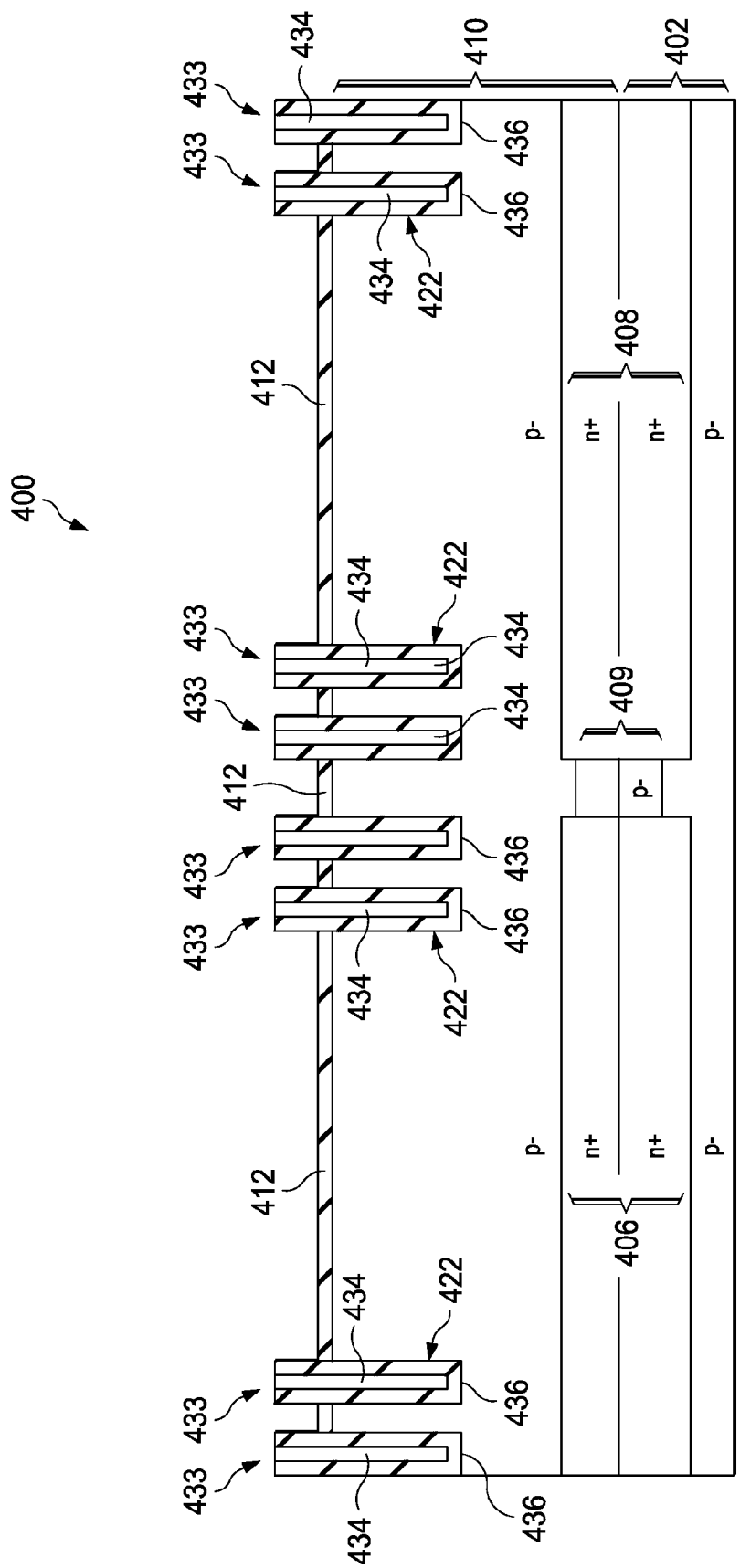
Figure 4H:
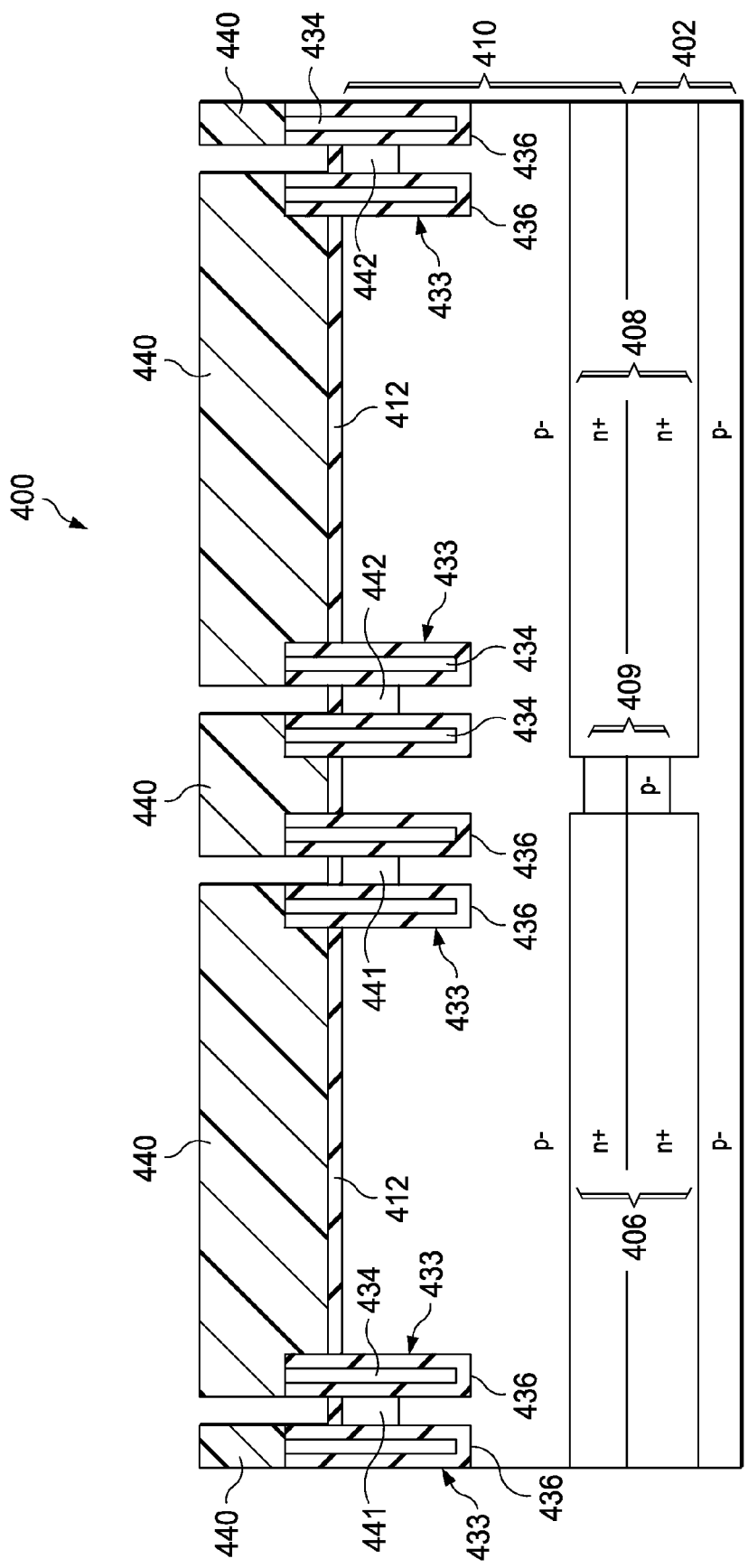

As shown in FIG. 4G, after the deep trench isolation structures 433 have been formed, nitride layer 414 is removed using conventional procedures. Following this, as shown in FIG. 4H, a patterned photoresist layer 440 is formed on the top surface of oxide layer 412 and the deep trench isolation structures 433 in a conventional manner.

(Optionally, nitride layer 414 and oxide layer 412 can be removed during the planarization step so that the top surfaces of the deep trench isolation structures 433 and the top surface of epitaxial layer 410 lie in the same horizontal plane. Patterned photoresist layer 440 can then be formed on epitaxial layer 410 or on a sacrificial oxide layer that is formed on epitaxial layer 440 following the planarization step.)

Once patterned photoresist layer 440 has been formed, an n-type dopant, such as phosphorous or arsenic, is implanted into epitaxial layer 410 a number of times with a number of implant energies to form an n+ region 441 in epitaxial layer 410 that lies above n+ buried layer 406 and extends up to the top surface of epitaxial layer 410.

The implant also forms an n+ region 442 in epitaxial layer 410 that lies above n+ buried layer 408 and extends up to the top surface of epitaxial layer 410. The n+ regions 441 and 442 have a maximum depth of approximately 1500 Å, and lie between and touch the deep trench isolation structures 433. Patterned photoresist layer 440 is then removed in a conventional manner.

Figure 4I:
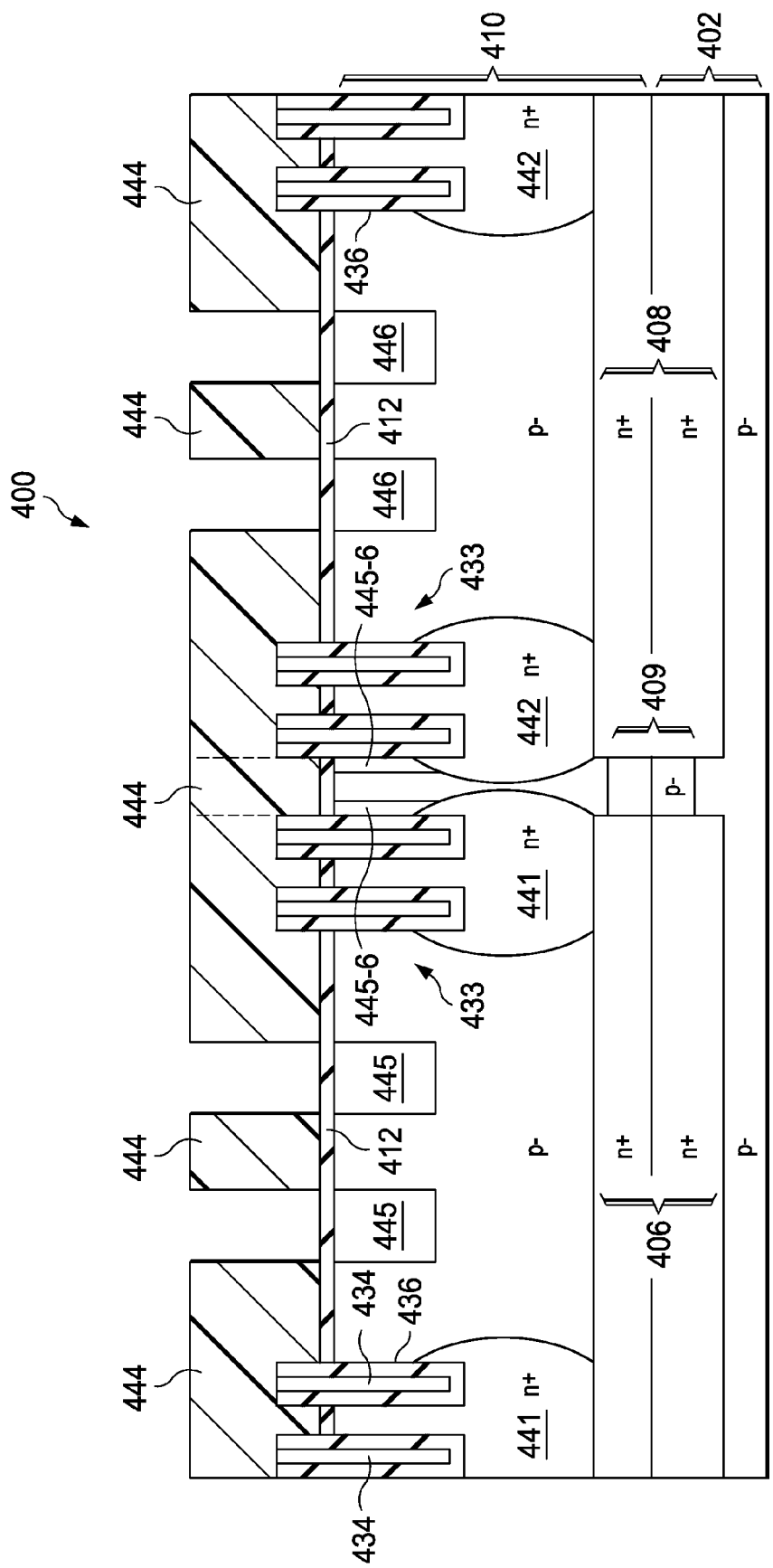

As shown in FIG. 4I, after patterned photoresist layer 440 has been removed, the resulting structure is conventionally annealed at 1150° C. to drive in the implants. The drive-in causes the n+ regions 441 and 442 to diffuse downward and then outward. When polysilicon is used to implement conductive layer 432, the polysilicon can withstand the 1150° C. anneal without detrimental stress effects.

After the drive-in, a patterned photoresist layer 444 is formed on the top surface of oxide layer 412 and the deep trench isolation structures 433 in a conventional manner. Once patterned photoresist layer 444 has been formed, an n-type dopant, such as phosphorous or arsenic, is implanted into epitaxial layer 410 a number of times with a number of implant energies to form an n– drift region 445 in epitaxial layer 410 that lies above n+ buried layer 406.

The implant also forms an n– drift region 446 in epitaxial layer 410 that lies above n+ buried layer 408. Further, as shown by the dashed lines in FIG. 4I, to support 40V operation, patterned photoresist layer 444 can be formed so that a number of n– regions 445-6 can be formed in the top surface of epitaxial layer 410 at the same time that the n– drift regions 445 and 446 are formed. Each n– region 445-6 lies above p– buried region 409, and laterally surrounds a pair of deep trench isolation structures 433. Patterned photoresist layer 444 is then removed in a conventional manner. After patterned photoresist layer 444 has been removed, the resulting structure is annealed at 1100° C. in a conventional fashion to drive in the implants.

Figure 4J:
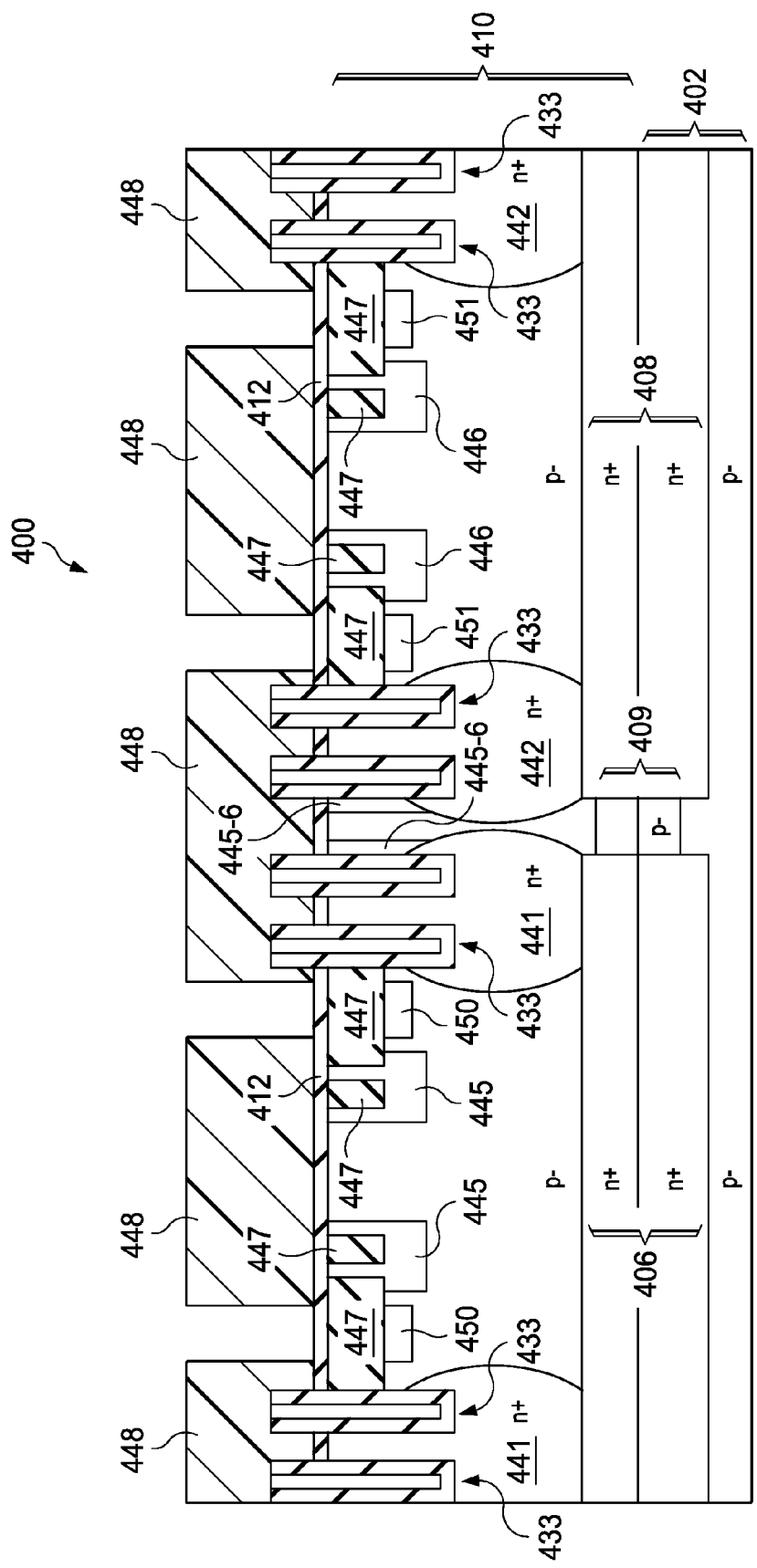

As shown in FIG. 4J, after the drive in, a number of shallow trench isolation structures 447 approximately 4000 Å deep are formed in the top portion of epitaxial layer 410 in a conventional manner. To prevent defects from occurring, high temperature diffusion should be avoided after the shallow trench isolation structures 447 have been formed. In the present example, one of the shallow trench isolation structures 447 is formed in n-drift region 445, and one of the shallow trench isolation structures 447 is formed in n– drift region 446.

After the shallow trench isolation structures 447 have been formed, a patterned photoresist layer 448 is formed on the top surface of oxide layer 412 and the deep trench isolation structures 433 in a conventional manner. Once patterned photoresist layer 448 has been formed, a p-type dopant, such as boron, is implanted into epitaxial layer 410 a number of times with a number of implant energies to form a p-type channel stop region 450 in a portion of epitaxial layer 410 that lies above n+ buried layer 406. Channel stop region 450 also touches and lies below a shallow trench isolation structure 447.

The implant also forms a p-type channel stop region 451 in a portion of epitaxial layer 410 that lies above n+ buried layer 408. Channel stop region 451 also touches and lies below a shallow trench isolation structure 447. Patterned photoresist layer 448 is then removed in a conventional fashion. After patterned photoresist layer 448 has been removed, the resulting structure is rapidly thermally annealed (RTA) at 1050° C. in a conventional manner to repair the lattice damage from the implants. RTA is a short process which is allows substantially no diffusion.

Figure 4K:
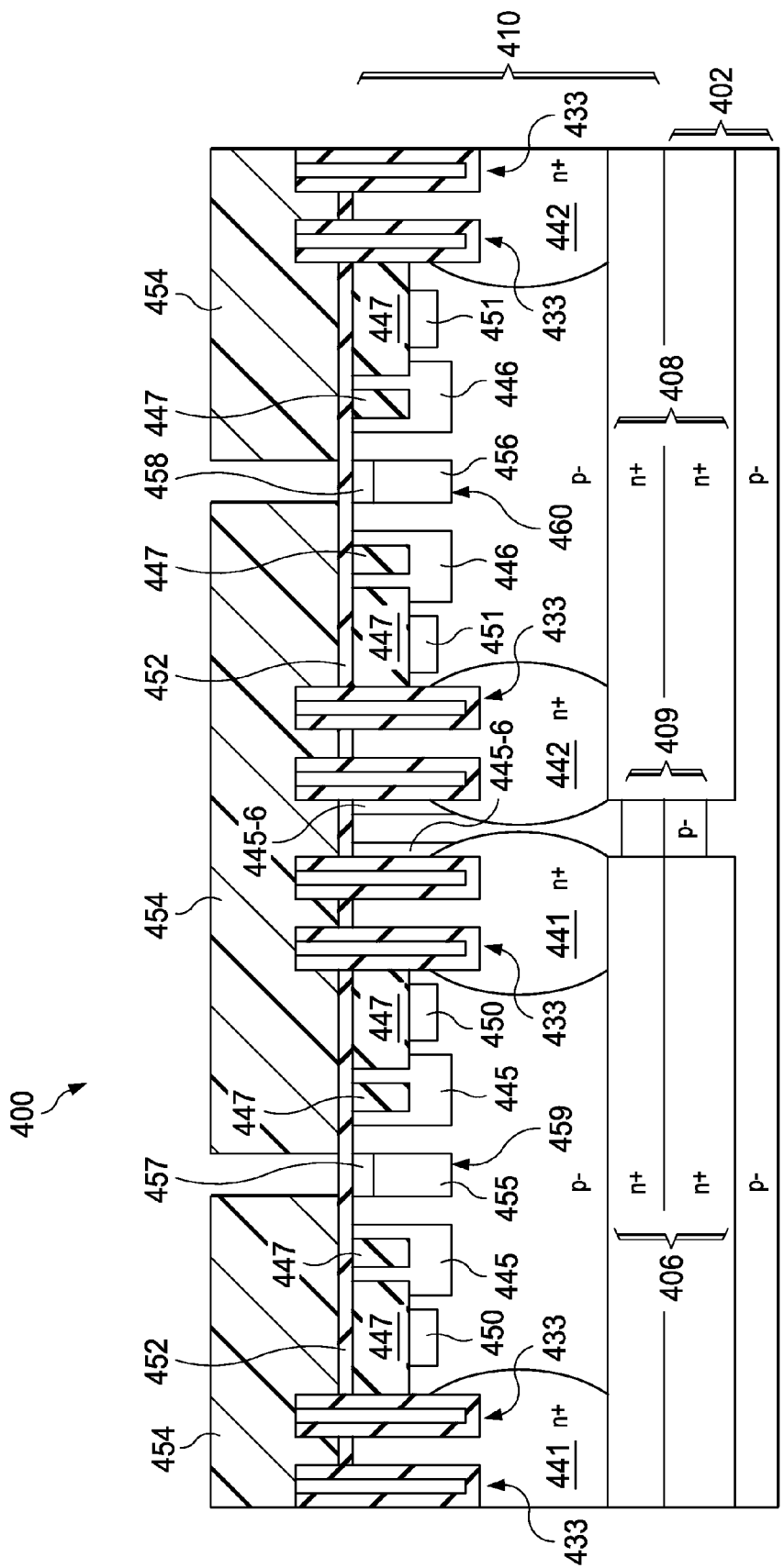

Next, as shown in FIG. 4K, after the channel stop regions 450 and 451 have been formed, oxide layer 412 is removed in a conventional manner. After oxide layer 412 has been removed, a gate oxide layer 452 is formed on the p-type regions 450 and 451 and the n-type regions 445 and 446 in a conventional fashion.

Following this, a patterned photoresist layer 454 is formed on the top surface of gate oxide layer 452 and the deep trench isolation structures 433 in a conventional manner. Once patterned photoresist layer 454 has been formed, a p-type dopant, such as boron, is implanted into epitaxial layer 410 a number of times with a number of implant energies to form a p-type region 455 in a portion of epitaxial layer 410 that lies above n+ buried layer 406. The implant also forms a p-type region 456 in a portion of epitaxial layer 410 that lies above n+ buried layer 408.

Following the formation of the p-type regions 455 and 456, an n-type dopant, such as arsenic, is implanted into epitaxial layer 410 a number of times with a number of implant energies to form an n-type region 457 in p-type region 455 and an n-type region 458 in p-type region 456.

Thus, the p-type and n-type dopants are implanted through the same openings in photoresist layer 454. Further, p-type region 455 and n-type region 457 form a first double diffused well (Dwell) 459, while p-type region 456 and n-type region 458 form a second Dwell 460. Patterned photoresist layer 454 is then removed in a conventional manner.

Due to the difference in the diffusivity coefficients between boron and arsenic, the channel length is determined by the thermal budget and not by the dimensions of the to-be-formed gate. The implant dose of boron is optimized to meet the target threshold voltage and the depths of the Dwells 459 and 460 are controlled by the boron implant energy.

Figure 4L:
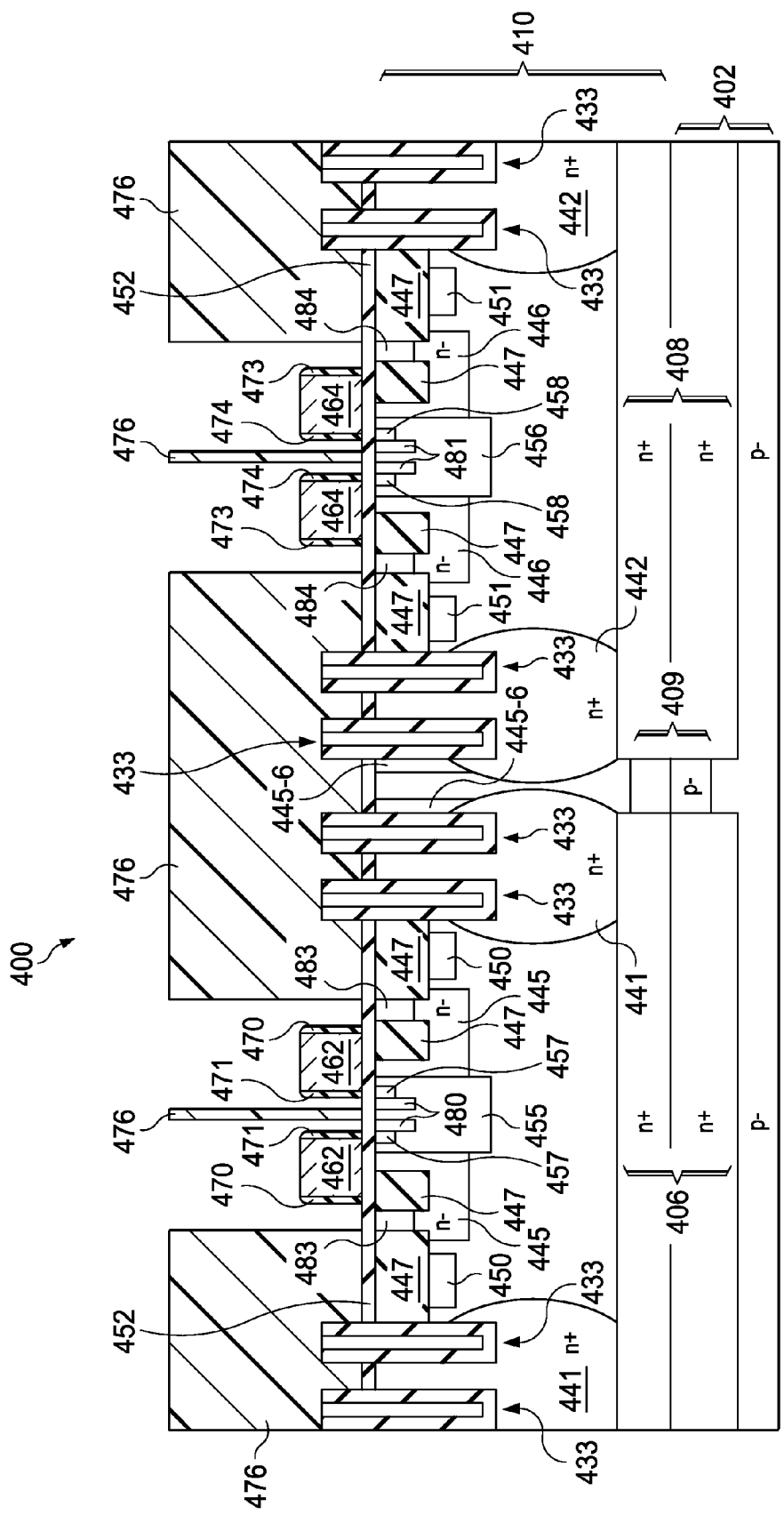

As shown in FIG. 4L, after patterned photoresist layer 454 has been removed, a gate 462 is formed on gate oxide layer 452 to lie over p-type region 455, and a gate 464 is formed on gate oxide layer 452 to lie over p-type region 456. The gates 462 and 464 are conventionally formed. For example, the gates 462 and 464 can be formed by depositing a layer of polysilicon, followed by a mask and etch step.

Following this, sidewall spacers 470 and 471 are formed to touch the outside and inside sidewalls, respectively, of gate 462, and sidewall spacers 473 and 474 are formed to touch the outside and inside sidewalls, respectively, of gate 464. The sidewall spacers 470, 471, 473, and 474 are conventionally formed. For example, the sidewall spacers 470, 471, 473, and 474 can be formed by depositing an oxide layer and a nitride layer, followed by an anisotropic etch.

After the sidewall spacers 470, 471, 473, and 474 have been formed, a patterned photoresist layer 476 is formed on the top surfaces of the deep trench isolation structures 433, gate oxide layer 452, the gates 462 and 464, and the sidewall spacers 470, 471, 473, and 474 in a conventional manner.

Once patterned photoresist layer 476 has been formed, an n-type dopant, such as phosphorous or arsenic, is implanted into epitaxial layer 410 to form an n+ source region 480 that touches p-type region 455, an n+ source region 481 that touches p-type region 456, an n+ drain region 483 that touches n– drift region 445, and an n+ drain region 484 that touches n– drift region 446. Patterned photoresist layer 476 is then removed in a conventional manner.

Figure 4M:
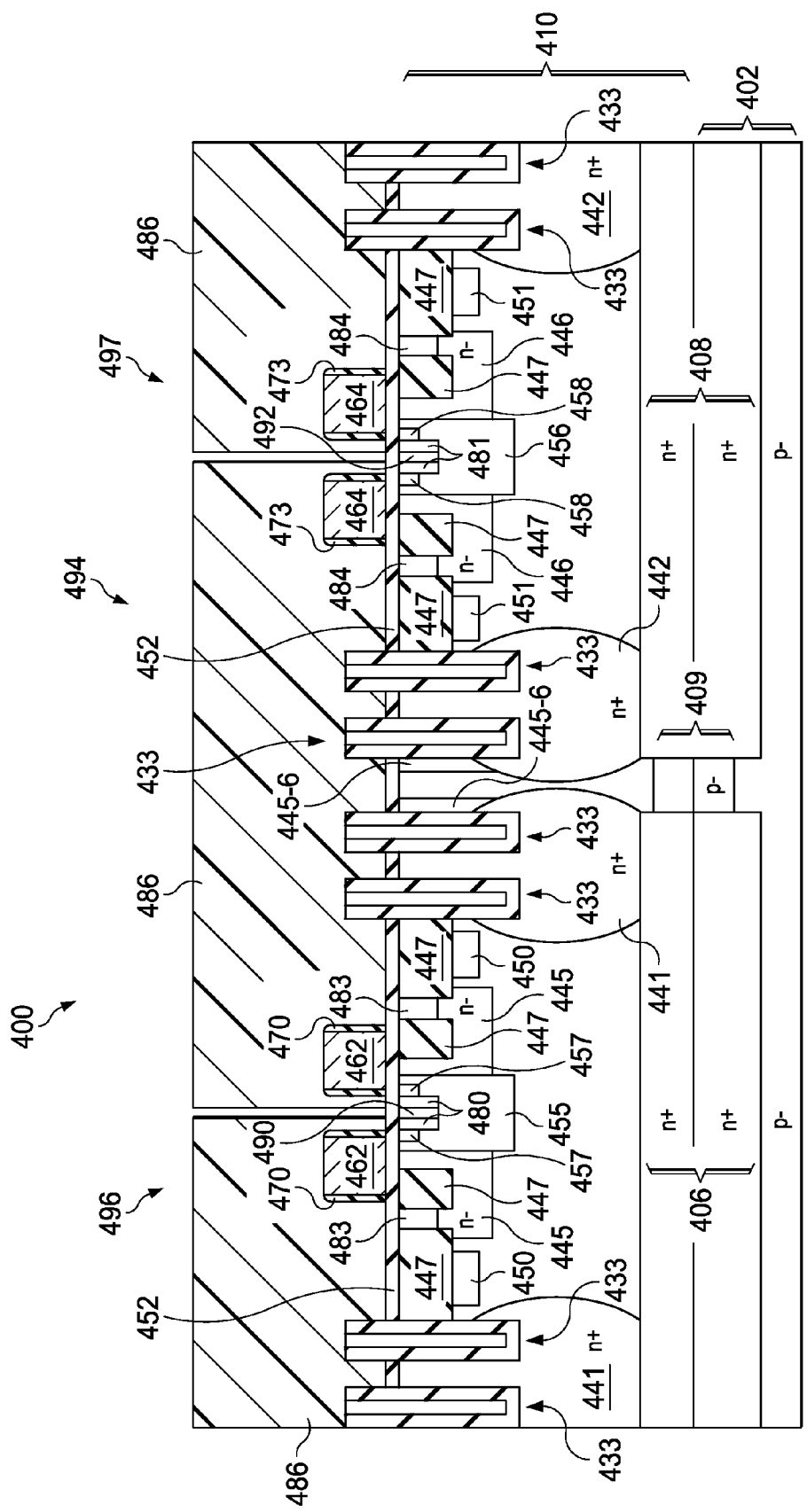

As shown in FIG. 4M, after patterned photoresist layer 476 has been removed, a patterned photoresist layer 486 is formed on the top surfaces of the deep trench isolation structures 433, gate oxide layer 452, the gates 462 and 464, and the sidewall spacers 470, 471, 473, and 474 in a conventional manner.

Once patterned photoresist layer 486 has been formed, a p-type dopant, such as boron, is implanted into epitaxial layer 410 to form a p+ contact region 490 that touches p-type region 455, and a p+ contact region 492 that touches p-type region 456. Patterned photoresist layer 486 is then removed in a conventional manner to form a LDMOS transistor array 494 with a first LDMOS transistor 496 and a second LDMOS transistor 497.

First LDMOS transistor 496 includes drain drift region 445, p-type region 455, source region 480, and drain region 483. Second LDMOS transistor 497 includes drain drift region 446, p-type region 456, source region 481, and drain region 484. Following this, method 400 continues with conventional steps to complete the formation of an array of LDMOS transistors.

Figure 5B:
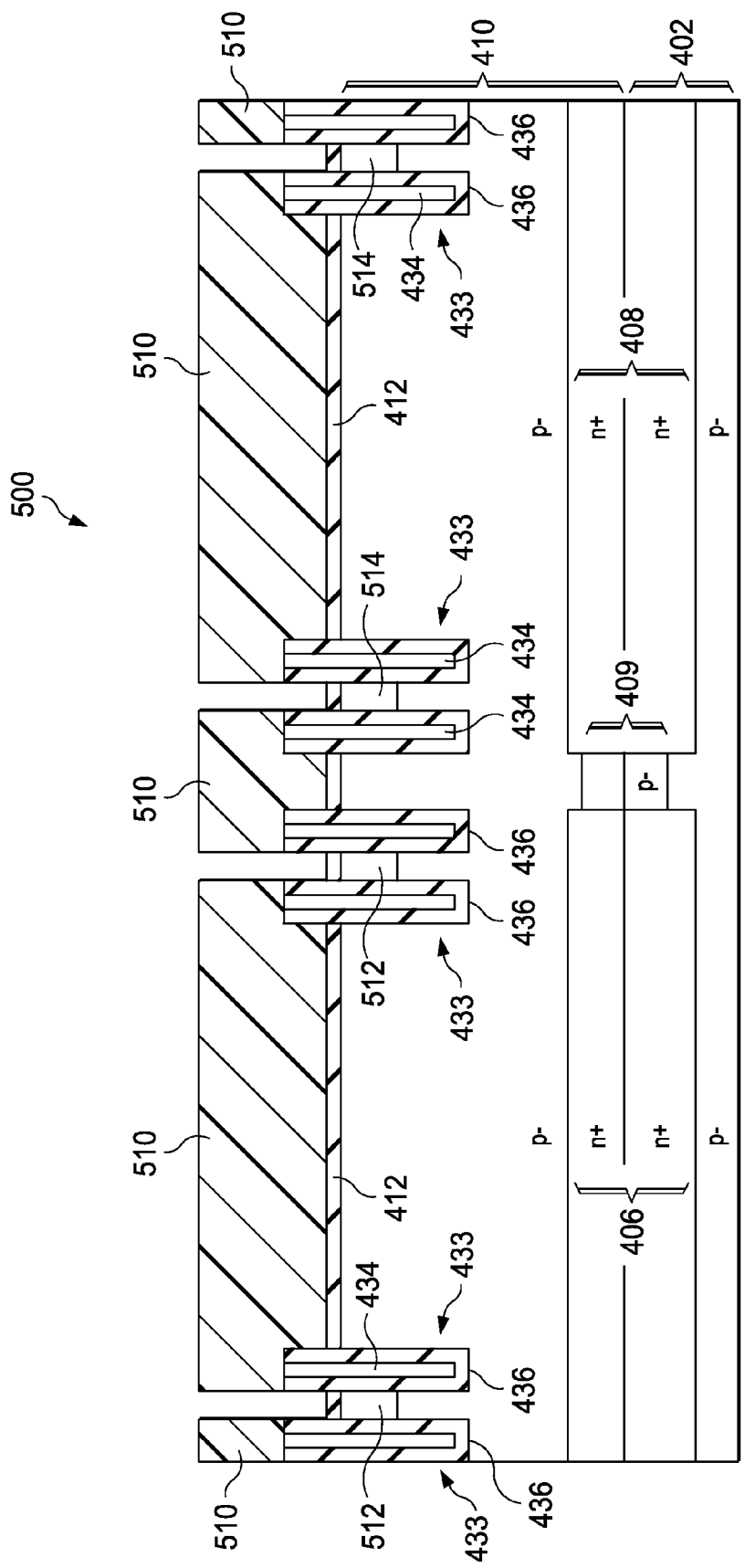
Figure 5C:
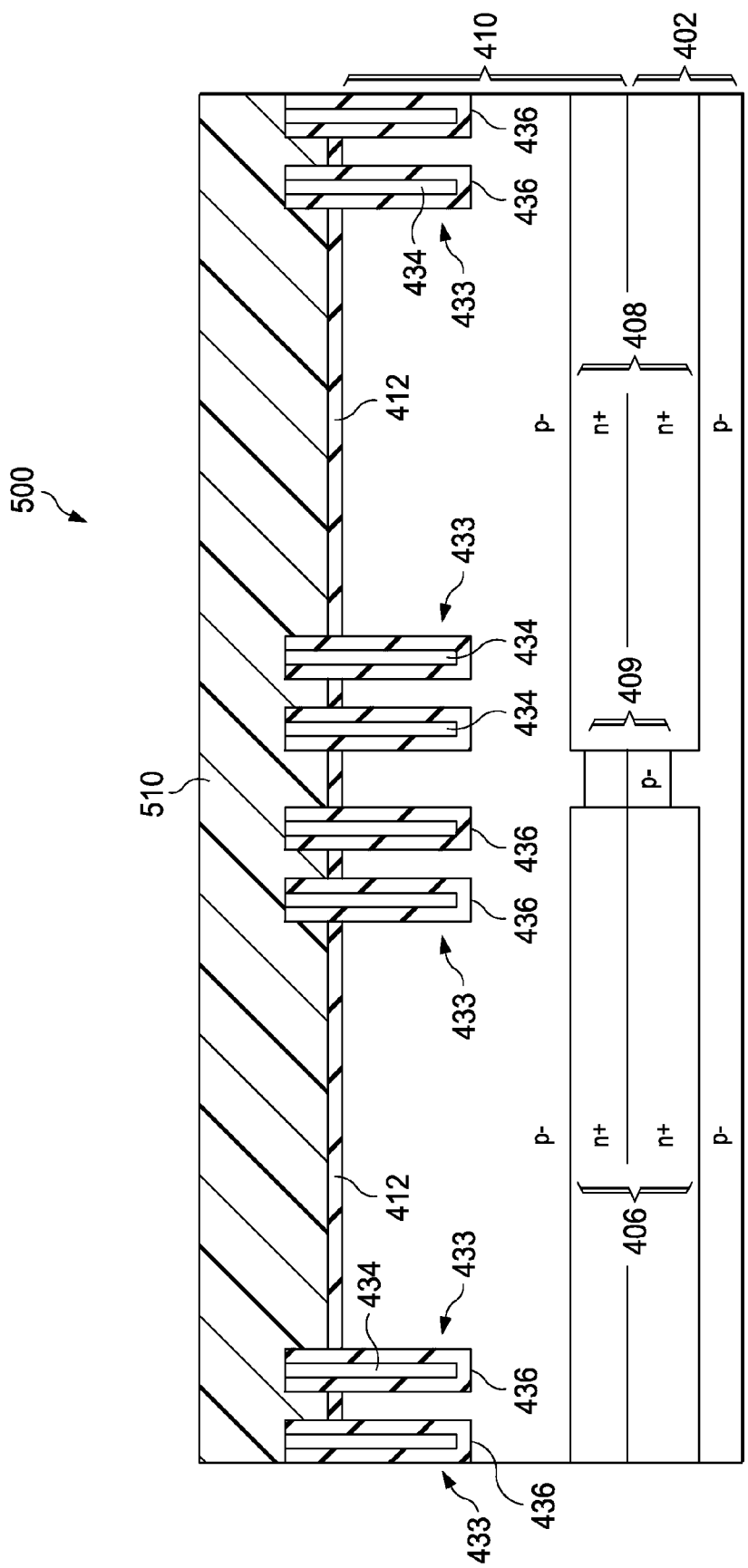

FIGS. 5A-5C show views that illustrate an example of a method 500 of forming a LDMOS transistor array in accordance with an alternate embodiment of the present invention. FIG. 5A shows a plan view, while FIG. 5B shows a cross-sectional view taken along line 5B-5B of FIG. 5A and FIG. 5C shows a cross-sectional view taken along line 5C-5C of FIG. 5A.

Method 500 is similar to method 400 and, as a result, utilizes the same reference numerals to designate the structures that are common to both methods. Method 500 is the same as method 400 up through the removal of nitride layer 414 (shown in FIG. 4G), and differs by forming a patterned photoresist layer 510 in lieu of patterned photoresist layer 440. Once patterned photoresist layer 510 has been formed, an n-type dopant, such as phosphorous or arsenic, is implanted into epitaxial layer 410 a number of times with a number of implant energies.

The implant forms a number of spaced-apart first n+ regions 512 in epitaxial layer 410 that each lies above n+ buried layer 406. The implant also forms a number of spaced-apart second n+ regions 514 in epitaxial layer 410 that each lies above n+ buried layer 408. The n+ regions 512 and 514 lie between and touch the deep trench isolation structures 433. Following the implant, patterned photoresist layer 510 is removed in a conventional manner. After this, method 500 continues on as in method 400.

Thus, unlike patterned photoresist layer 440, which has a continuous circular opening that lies over n+ buried layer 406 and a continuous circular opening that lies over n+ buried layer 408, patterned photoresist layer 510 has a number of spaced-apart first openings that are arranged in a circular shape over n+ buried layer 406 and a number of spaced-apart second openings that are arranged in a circular shape over n+ buried layer 408.

When the n+ regions 512 and 514 are subsequently driven in, the n+ regions 512 laterally diffuse together to form n+ region 441, while the n+ regions 514 laterally diffuse together to form n+ region 442. By forming the spaced-apart n+ regions 512 and 514, the maximum widths of the portions of the n+ regions 441 and 442 that lie below the deep trench isolation structures 433 can be reduced.

Figure 6B:
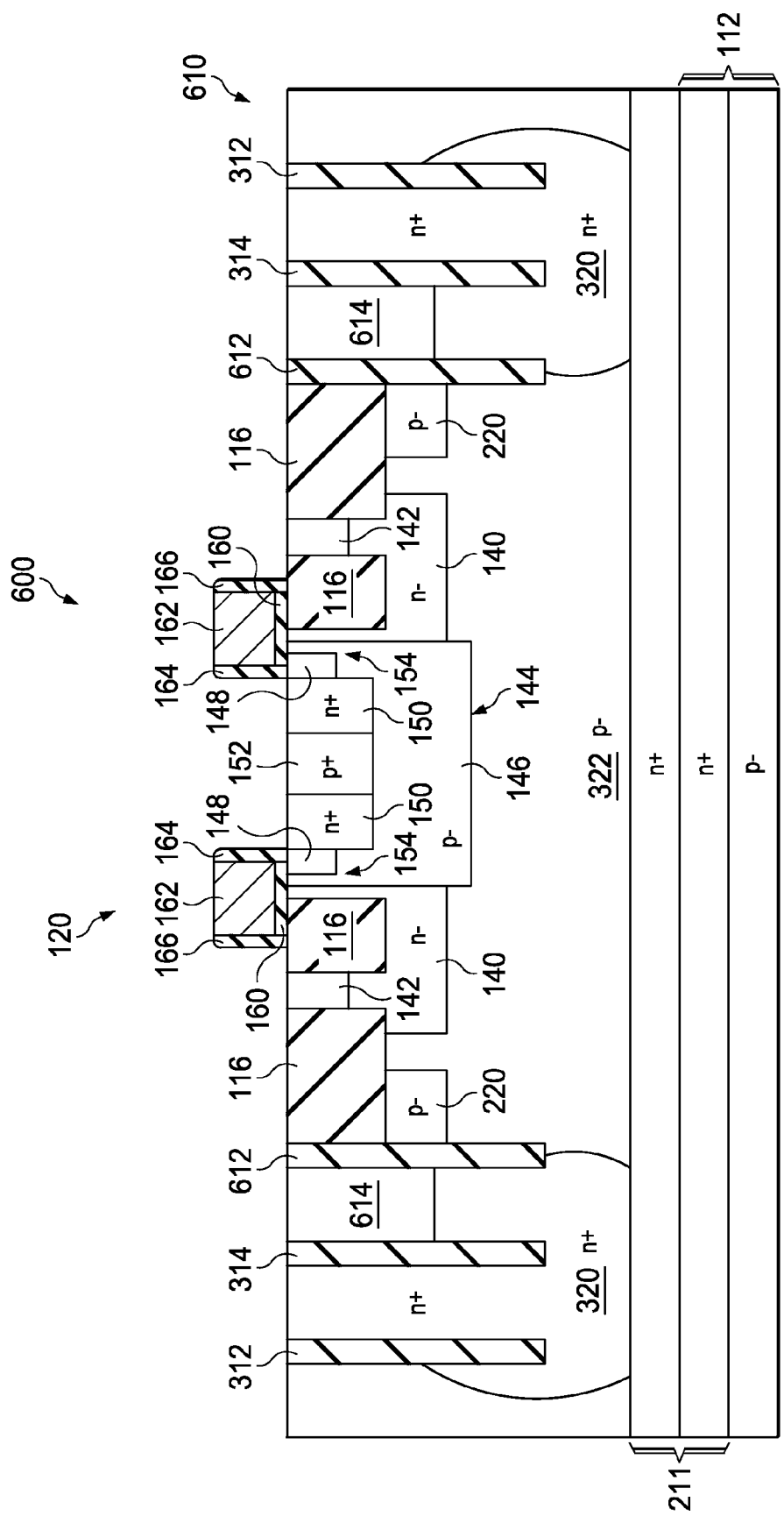

FIGS. 6A-6B show views that illustrate an example of a LDMOS transistor array 600 in accordance with an alternate embodiment of the present invention. FIG. 6A shows a plan view, while FIG. 6B shows a cross-sectional view taken along line 6B-6B of FIG. 6A. LDMOS transistor 600 array is similar to LDMOS transistor array 300 and, as a result, utilizes the same reference numerals to designate the structures that are common to both transistor arrays. (Only one transistor 120 is shown in FIGS. 6A-6B.)

As shown in FIGS. 6A-6B, LDMOS transistor array 600 differs from LDMOS transistor array 300 in that LDMOS transistor array 600 utilizes a semiconductor structure 610 in lieu of semiconductor structure 310. Semiconductor structure 610, in turn, is the same as semiconductor structure 310 except that semiconductor structure 610 also includes a number of insulating deep trench structures 612 that are formed in the top surface of epitaxial layer 114. (Only one structure 612 is illustrated.) Inner deep trench isolation structure 314 laterally surrounds insulating deep trench isolation structure 612.

Semiconductor structure 610 also differs from semiconductor structure 310 in that semiconductor structure 610 includes a number of n-type interface regions 614 that each touches and lies between an inner deep trench isolation structure 314 and an insulating deep trench isolation structure 612. (Only one region 614 is illustrated.) N-type interface region 614 extends down from the top surface of epitaxial layer 114, but is shallower than n+ region 320. N-type interface region 614 eliminates a floating junction which can cause premature junction breakdown of the isolation.

Figure 6D:
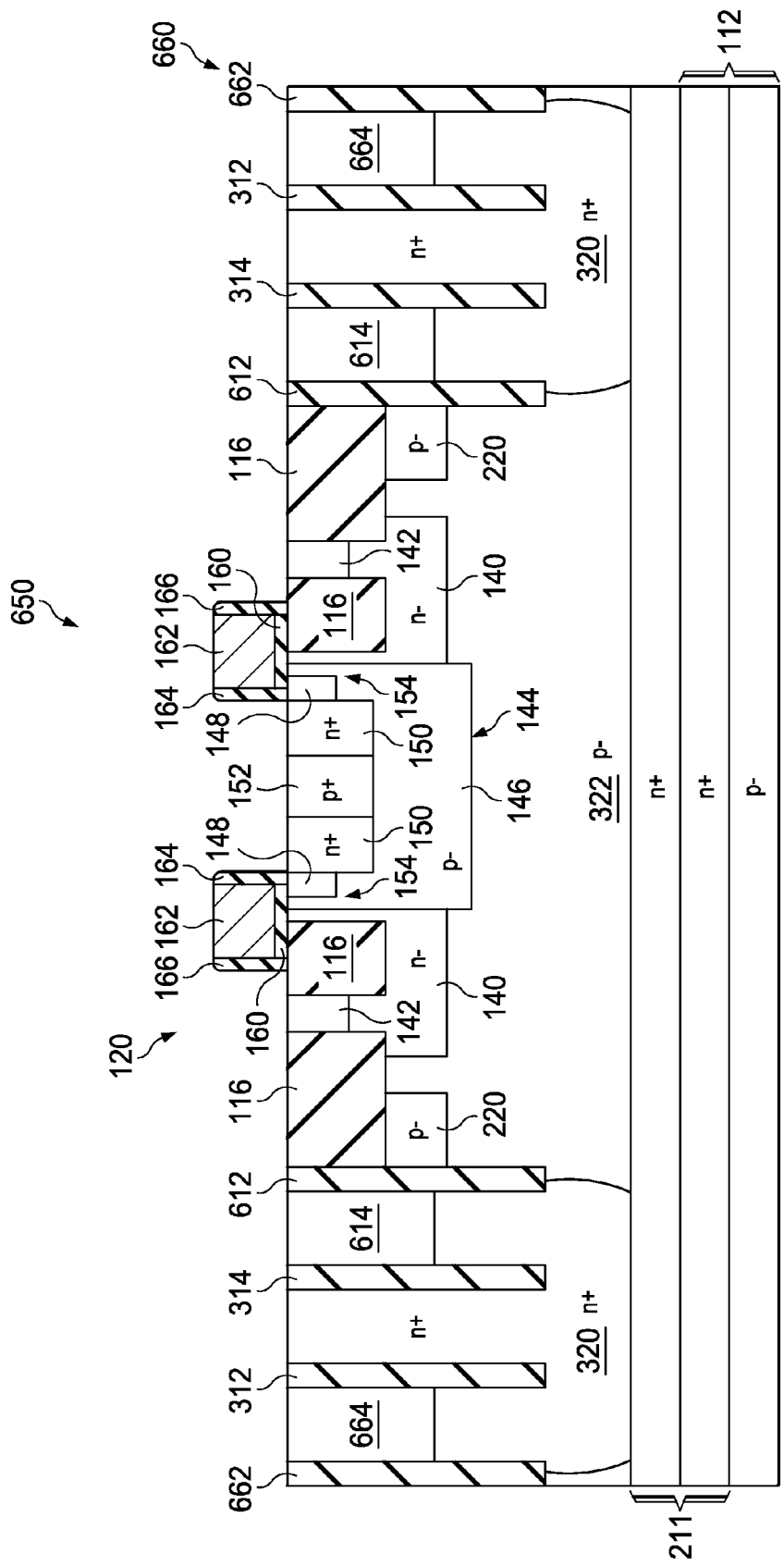

FIGS. 6C-6D show views that illustrate an example of a LDMOS transistor array 650 in accordance with an alternate embodiment of the present invention. FIG. 6C shows a plan view, while FIG. 6D shows a cross-sectional view taken along line 6D-6D of FIG. 6C. LDMOS transistor 650 array is similar to LDMOS transistor array 600 and, as a result, utilizes the same reference numerals to designate the structures that are common to both transistors.

As shown in FIGS. 6C-6D, LDMOS transistor array 650 differs from LDMOS transistor array 600 in that LDMOS transistor array 650 utilizes a semiconductor structure 660 in lieu of semiconductor structure 610. Semiconductor structure 660, in turn, is the same as semiconductor structure 610 except that semiconductor structure 660 also includes a number of insulating deep trench structures 662 that are formed in the top surface of epitaxial layer 114. (Only one structure 662 is illustrated.) Each insulating deep trench isolation structure 662 laterally surrounds an outer deep trench isolation structure 312.

Semiconductor structure 660 also differs from semiconductor structure 610 in that semiconductor structure 660 includes a number of n-type interface regions 664 that each touches and lies between an outer deep trench isolation structure 312 and an insulating deep trench isolation structure 662. Each n-type interface region 664 extends down from the top surface of epitaxial layer 114, but is shallower than n+ region 320.

The LDMOS transistor arrays 600 and 650 operate the same as LDMOS transistor array 300, except that the transistor arrays 600 and 650 can be formed to be smaller than transistor array 300. In the FIGS. 6A-6B example, the outward lateral and upward diffusion of n+ region 320 can be suppressed by placing insulating deep trench structure 612 a distance inside of inner deep trench isolation structure 314. By placing insulating deep trench structure 612 the distance inside of inner deep trench isolation structure 314, the distance between n− drain drift region 140 and inner deep trench isolation structure 314 can be reduced. As a result, the footprint of LDMOS transistor array 600 becomes smaller than the footprint of LDMOS transistor array 300.

In the FIGS. 6C-6D example, the outward lateral and upward diffusion of n+ region 320 can also be suppressed by placing insulating deep trench structure 662 a distance outside of outer deep trench isolation structure 312. By placing insulating deep trench structure 662 the distance outside of outer deep trench isolation structure 312, the distance between adjacent transistors in a transistor array can be reduced.

Insulating deep trench structure 612 and insulating deep trench structure 662 can be formed in the same manner and at the same time as the deep trench isolation structures 433. In addition, n-type interface region 614 and n-type interface region 664 can be formed in the same manner and at the same time as the n-type drain drift regions 445 and 446.

Figure 7B:
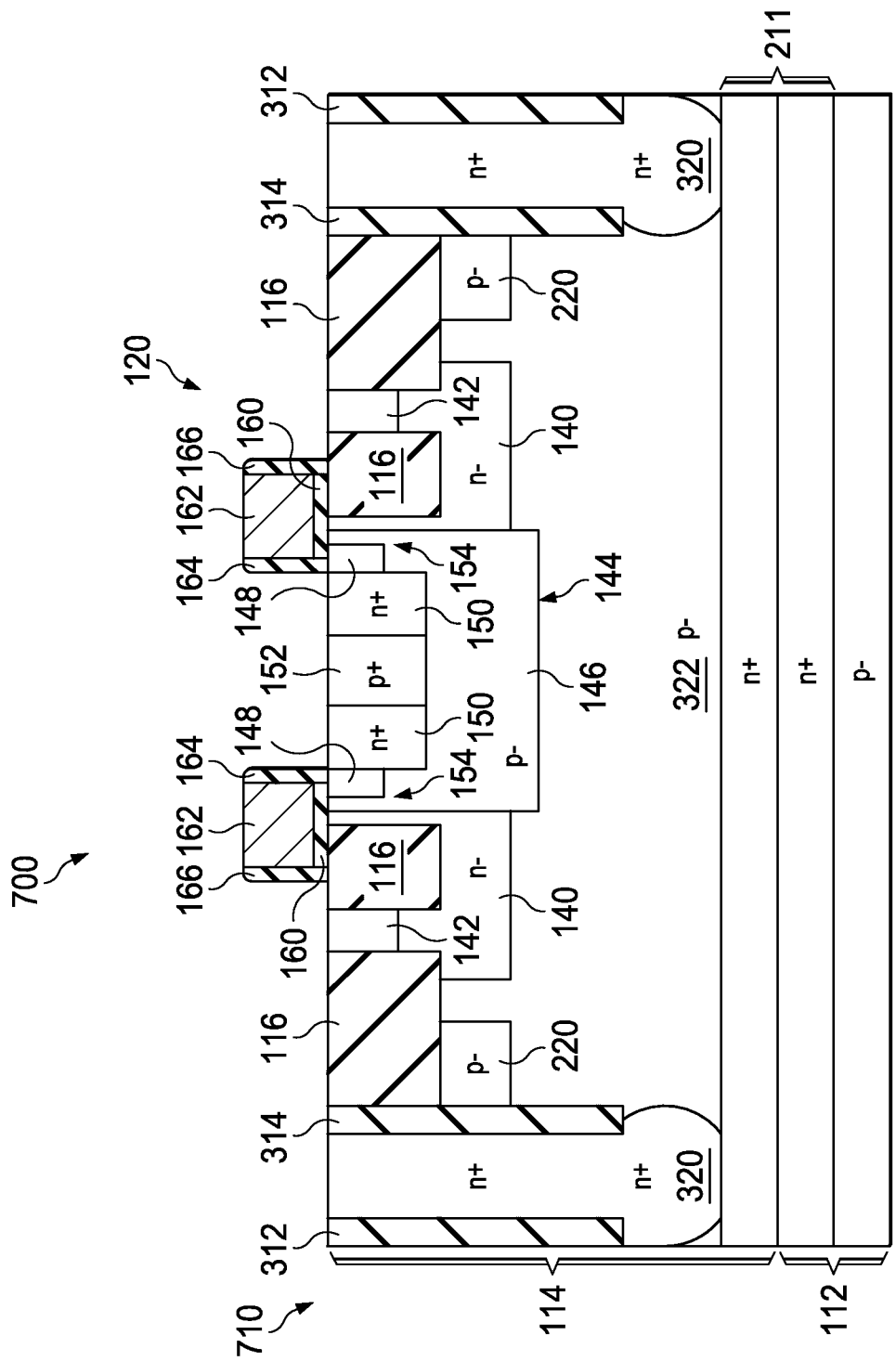

FIGS. 7A-7B show views that illustrate an example of a LDMOS transistor array 700 in accordance with an alternate embodiment of the present invention. FIG. 7A shows a plan view, while FIG. 7B shows a cross-sectional view taken along line 7B-7B of FIG. 7A. LDMOS transistor array 700 is similar to LDMOS transistor array 300 and, as a result, utilizes the same reference numerals to designate the structures that are common to both transistors. (Only one transistor 120 is illustrated.)

As shown in FIGS. 7A-7B, LDMOS transistor array 700 differs from LDMOS transistor array 300 in that LDMOS transistor array 700 utilizes a semiconductor structure 710 in lieu of semiconductor structure 310. Semiconductor structure 710, in turn, is the same as semiconductor structure 310 except that the deep trench isolation structures 312 and 314 are spaced further apart in semiconductor structure 710.

LDMOS transistor array 700 operates the same as LDMOS transistor array 300. LDMOS transistor array 700 is formed the same as the LDMOS transistors 496 and 497, except that the dopant for n+ region 320 lies between and spaced apart from the deep trench isolation structures 312 and 314 after implantation, but lies between and touches the deep trench isolation structures 312 and 314 after drive in. Increasing the lateral spacing between the deep trench isolation structures 312 and 314 allows n+ region 320 to laterally diffuse during drive in which, in turn, limits the lateral and upward diffusion of the dopants at the bottoms of the deep trench isolation structures 312 and 314.

Figure 8A:
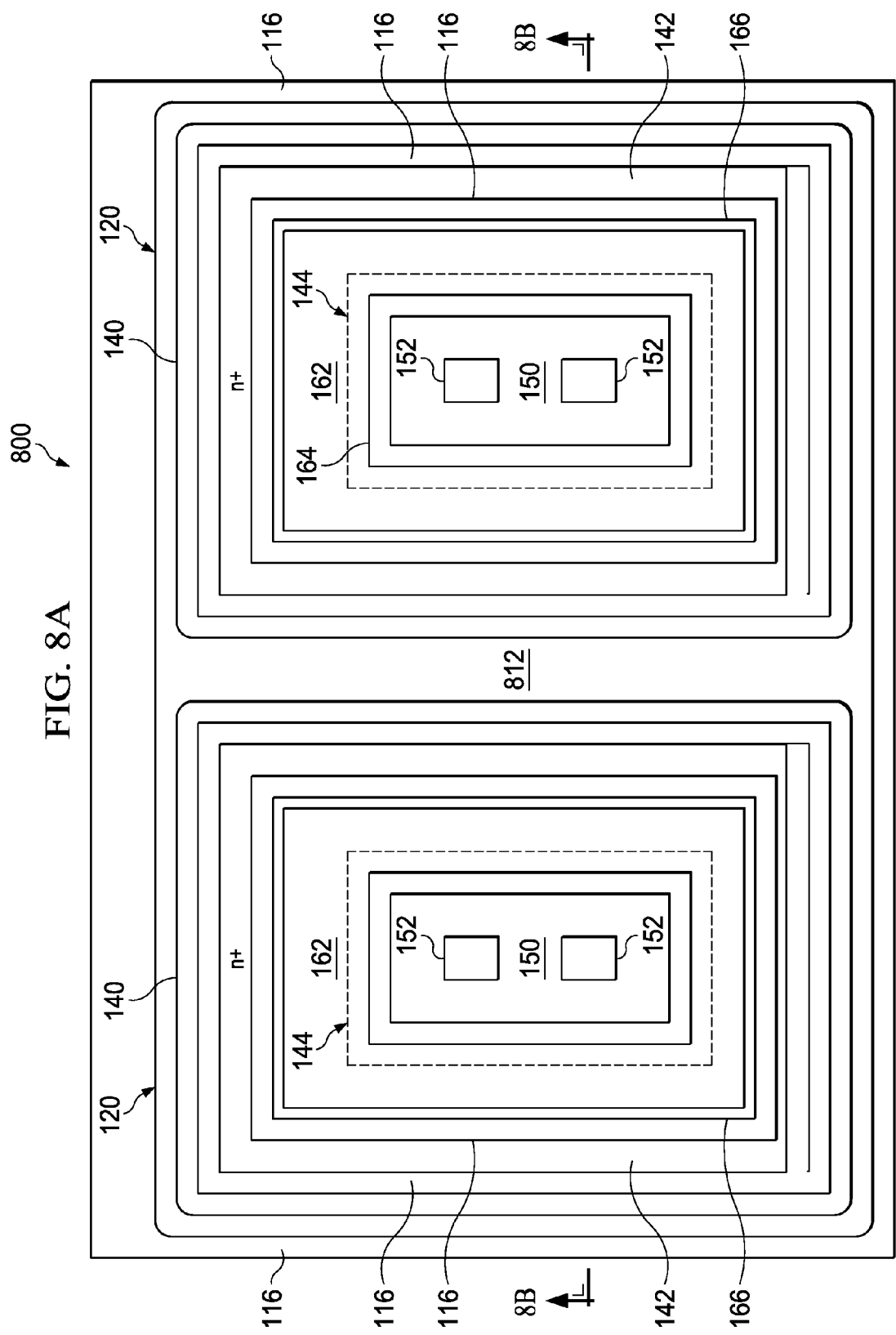
FIGS. 8A-8B are views illustrating an example of a LDMOS transistor array 800 in accordance with the present invention.
Figure 8B:
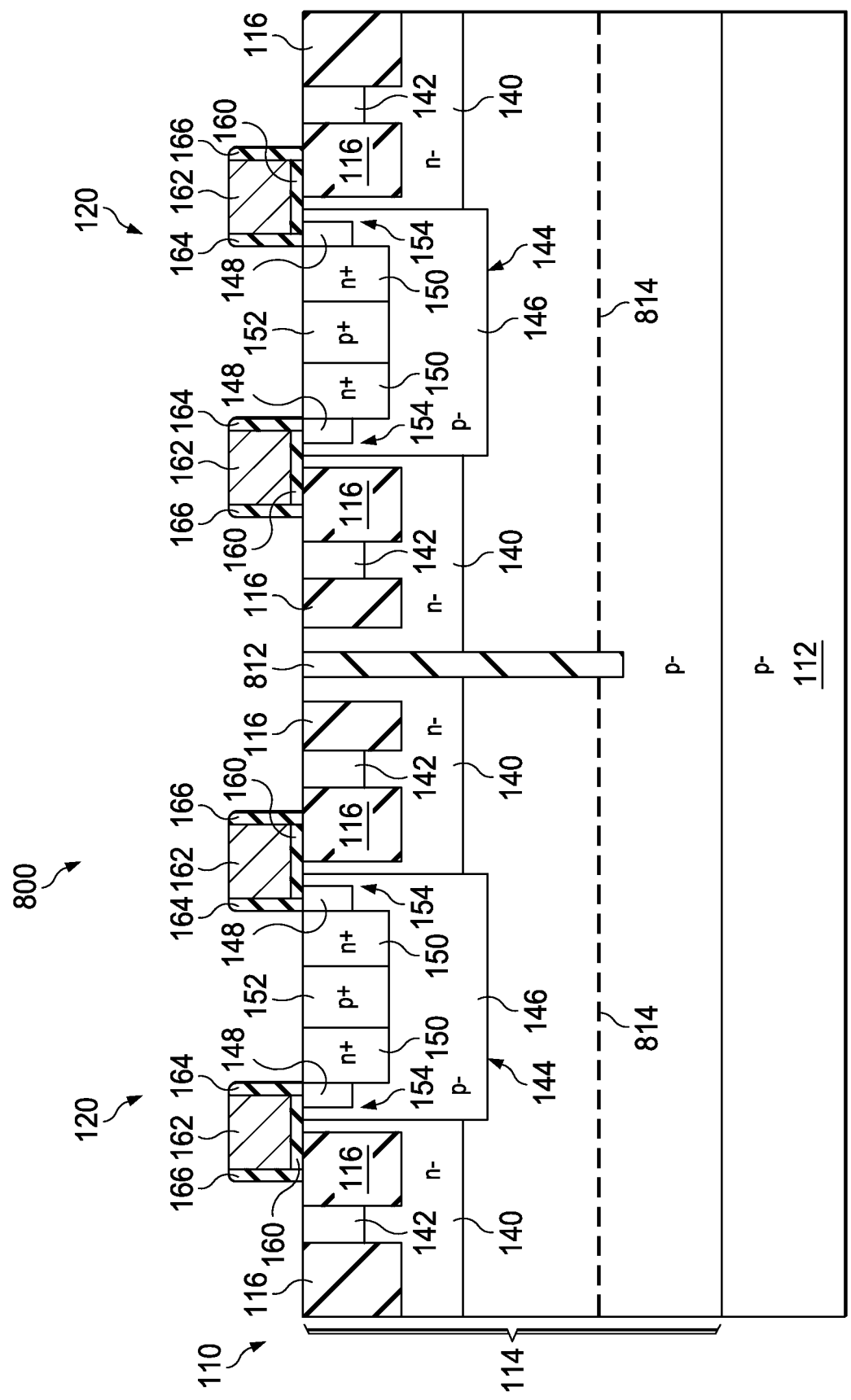

FIGS. 8A-8B show views that illustrate an example of a LDMOS transistor array 800 in accordance with the present invention. FIG. 8A shows a plan view, while FIG. 8B shows a cross-sectional view taken along line 8B-8B of FIG. 8A. Array 800 is similar to array 200 and, as a result, utilizes the same reference numerals to designate the structures that are common to both arrays.

Array 800 differs from array 200 in that array 800 includes a deep trench isolation structure 812 that touches the drain drift regions 140 of adjacent transistors 120. Deep trench isolation structure 812 has round corners (when viewed from above), and a bottom surface that touches a p-type region (epitaxial layer 114). In addition, deep isolation structure 812 has a depth that is substantially deeper than a depth of the shallow trench isolation structures 116.

Further, deep isolation structure 812 laterally surrounds a number of portions 814 of epitaxial layer 114. Each portion 814 of epitaxial layer 114 surrounded by deep isolation structure 812 includes a drain drift region 140 and a Dwell 144 of a transistor 120. Array 800 can be formed using the same steps as in method 400, excluding the steps that form structures which are not present in array 800.

One of the advantages of transistor array 800 is that the minimum lateral spacing between adjacent LDMOS transistors 120 is substantially less than the minimum lateral spacing between adjacent LDMOS transistors 120 in array 200. For example, 40V isolation for adjacent LDMOS transistors 120 in array 200 typically requires a minimum lateral spacing of 5.65 um, whereas 40V isolation for adjacent LDMOS transistors 120 in array 800 can utilize a minimum lateral spacing of 0.7 um, which is an 88% reduction.

It should be understood that the above descriptions are examples of the present invention, and that various alternatives of the invention described herein may be employed in practicing the invention. For example, although the present invention has been described in terms of a LDMOS transistor, the present invention also applies to other MOS based structures. Thus, it is intended that the following claims define the scope of the invention and that structures and methods within the scope of these claims and their equivalents be covered thereby.

What is claimed is:

1. A semiconductor structure comprising:
    a substrate having a first conductivity type and a top surface;
    an epitaxial layer having the first conductivity type, a bottom surface that touches the top surface of the substrate, and a top surface;
    a buried region having a second conductivity type, the buried region touching and lying below a portion of the epitaxial layer;
    a shallow trench isolation structure formed in the top surface of the epitaxial layer to extend down into the epitaxial layer;
    an inner deep trench isolation structure formed in the top surface of the epitaxial layer to extend down into the epitaxial layer, the inner deep trench isolation structure laterally surrounding the shallow trench isolation structure;
    an outer deep trench isolation structure formed in the top surface of the epitaxial layer to extend down into the epitaxial layer, the outer deep trench isolation structure laterally surrounding the inner deep trench isolation structure; and a doped region formed in the top surface of the epitaxial layer to extend down into the epitaxial layer and below the inner and outer deep trench isolation structures to touch the buried region, the doped region having the second conductivity type, touching the inner and outer deep trench isolation structures, and laterally surrounding the portion of the epitaxial layer.

2. The semiconductor structure of claim 1 and further comprising an interface region of the second conductivity type that touches the inner deep trench isolation structure, the inner deep trench isolation structure laterally surrounding the interface region, the interface region having a dopant concentration that is less than a dopant concentration of the doped region.

3. The semiconductor structure of claim 1 and further comprising a channel stop region of the first conductivity type that touches the shallow trench isolation structure, the inner deep trench isolation structure laterally surrounding the channel stop region.

4. The semiconductor structure of claim 1 and further comprising an insulating deep trench structure formed in the top surface of the epitaxial layer to extend down into the epitaxial layer, the insulating deep trench structure laterally surrounding the outer deep trench isolation structure, the insulating deep trench structure and the outer deep trench isolation structure having substantially equal depths.

5. The semiconductor structure of claim 1 and further comprising an insulating deep trench structure formed in the top surface of the epitaxial layer to extend down into the epitaxial layer, the inner deep trench isolation structure laterally surrounding the insulating deep trench structure, the insulating deep trench structure and the inner deep trench isolation structure having substantially equal depths.

6. The semiconductor structure of claim 1 and further comprising:
a source formed in the portion of the epitaxial layer, the source having the second conductivity type; and
a drain formed in the portion of the epitaxial layer, the drain being laterally spaced apart from the source, and having the second conductivity type, the shallow trench isolation structure lying laterally between the source and the drain.

7. The semiconductor structure of claim 1 and further comprising an interface region of the second conductivity type that touches and laterally surrounds the outer deep trench isolation structure, the interface region having a dopant concentration that is less than a dopant concentration of the doped region.

8. A method of forming a semiconductor structure, the method comprising:
forming a buried region in a substrate, the substrate having a first conductivity type, the buried region having a second conductivity type;
growing an epitaxial layer on the substrate, the epitaxial layer having a top surface and the first conductivity type, the buried region touching and lying below a portion of the epitaxial layer;
forming a shallow trench isolation structure in the top surface of the epitaxial layer to extend down into the epitaxial layer;
forming an inner deep trench isolation structure in the top surface of the epitaxial layer to extend down into the epitaxial layer, the inner deep trench isolation structure laterally surrounding the shallow trench isolation structure;
forming an outer deep trench isolation structure in the top surface of the epitaxial layer to extend down into the epitaxial layer, the outer deep trench isolation structure laterally surrounding the inner deep trench isolation structure; and
forming a doped region in the top surface of the epitaxial layer to extend down into the epitaxial layer and below the inner and outer deep trench isolation structures to touch the buried region, the doped region having the second conductivity type, touching the inner and outer deep trench isolation structures, and laterally surrounding the portion of the epitaxial layer.

9. The method of claim 8 wherein the doped region includes a plurality of spaced-apart regions of the second conductivity type, the plurality of spaced-apart regions of the second conductivity type touching the inner and outer deep trench isolation structures, and lying between the inner and outer deep trench isolation structures.

10. The method of claim 8 wherein a region of the second conductivity type that includes the doped region and the buried region lies completely between the portion of the epitaxial layer and a remaining portion of the epitaxial layer.

11. The method of claim 8 wherein the doped region has a first portion with a dopant concentration and a second portion with a dopant concentration that is substantially less than the dopant concentration of the first portion.

12. The method of claim 8 and further comprising forming an insulating deep trench structure in the top surface of the epitaxial layer to extend down into the epitaxial layer, the insulating deep trench structure laterally surrounding the outer deep trench isolation structure, the insulating deep trench structure and the outer deep trench isolation structure having substantially equal depths.

13. The method of claim 8 and further comprising forming an insulating deep trench structure in the top surface of the epitaxial layer to extend down into the epitaxial layer, the inner deep trench isolation structure laterally surrounding the insulating deep trench structure, the insulating deep trench structure and the inner deep trench isolation structure having substantially equal depths.

* * * * *